(12) United States Patent
Kawamura et al.

(10) Patent No.: US 7,528,542 B2
(45) Date of Patent: May 5, 2009

(54) ORGANIC ELECTROLUMINESCENT DEVICE

(75) Inventors: Hisayuki Kawamura, Sodegaura (JP); Mineyuki Kubota, Sodegaura (JP); Masakazu Funahashi, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 433 days.

(21) Appl. No.: 11/288,281

(22) Filed: Nov. 29, 2005

(65) Prior Publication Data

US 2006/0158102 A1 Jul. 20, 2006

(30) Foreign Application Priority Data

Dec. 1, 2004 (JP) ............................. 2004-348675

(51) Int. Cl.
  *H05B 33/00* (2006.01)
(52) U.S. Cl. .................. 313/504; 313/506; 428/917
(58) Field of Classification Search .................. 313/504, 313/506; 428/690, 917
See application file for complete search history.

(56) References Cited

U.S. PATENT DOCUMENTS

| 2006/0043885 | A1* | 3/2006 | Poplavskyy et al. | 313/506 |
| 2006/0105199 | A1* | 5/2006 | Gerlach et al. | 428/690 |
| 2007/0099025 | A1* | 5/2007 | Oshiyama et al. | 428/690 |

FOREIGN PATENT DOCUMENTS

| JP | 06-207170 | 7/1994 |
| JP | 09-134786 | 5/1997 |
| JP | 2000-106277 | 4/2000 |
| JP | 2001-237078 | 8/2001 |
| JP | 2001-250690 | 9/2001 |
| JP | 2002-038140 | 2/2002 |
| JP | 2003-068465 | 3/2003 |
| JP | 2003-068466 | 3/2003 |
| JP | 2003-187978 | 7/2003 |
| JP | 2004-006165 | 1/2004 |
| JP | 2004-014172 | 1/2004 |
| JP | 2004-171828 | 6/2004 |
| JP | 2004-185967 | 7/2004 |
| JP | 2004-221045 | 8/2004 |
| JP | 2004-311420 | 11/2004 |
| JP | 2005-108572 | 4/2005 |
| JP | 2005-108730 | 4/2005 |
| WO | 99/48160 | 9/1999 |
| WO | 02/104080 | 12/2002 |
| WO | 03/022007 | 3/2003 |
| WO | 2004/047499 | 6/2004 |

* cited by examiner

*Primary Examiner*—Ashok Patel
(74) *Attorney, Agent, or Firm*—Steptoe & Johnson LLP

(57) ABSTRACT

An organic electroluminescent device 1 including: an anode 12, a cathode 14 and an organic emitting layer 13 held therebetween, the organic emitting layer 13 containing one or more host materials, a hole trapping dopant and an electron trapping dopant. The lifetime of an organic EL device 1 can be improved by causing a hole-trapping dopant and an electron-trapping dopant to be together present in its organic emitting layer.

12 Claims, 3 Drawing Sheets

ORGANIC ELECTROLUMINESCENT DEVICE

TECHNICAL FIELD

The invention relates to an organic electroluminescent device.

TECHNICAL BACKGROUND

Organic electroluminescent devices, which may be referred to as organic EL devices, having an organic emitting layer have been promisingly expected to be used as large-area full-color display devices of a solid-state emitting type, and many developments thereof have been performed.

Recently, practical use of organic EL device displays has been started, and thus the organic EL devices have been desired to have a higher luminance, a higher efficiency and a longer lifetime.

A technique of incorporating a very small amount of a fluorescent molecule (dopant) into an organic emitting layer made mainly of a host material is known in order to meet the above-mentioned desires.

There is also disclosed, for example, an organic EL device having an emitting layer including a mixture of a first component for accepting positive charge carriers (holes) from a first-charge-carrier injecting layer (hole-transporting layer), a second component for accepting negative carriers (electrons) from a second-charge-carrier injecting layer (electron-transporting layer), and a third component which is an organic emitting component for emitting light by recombination of the charge carriers from the first and second components wherein at least one of the first, second and third components is combined with the others of the first, second and third components, so as to form a semiconductor interface of type II (see, for example, Japanese Patent Application National Publication No. 2002-507825).

In this device, the carriers (holes and electrons) injected in the emitting layer are made into a state that their electric charges are separated, whereby the device gives highly efficient luminescence.

Besides, the following are disclosed: an organic EL device having two components of an emitting material and a dopant for improving the dispersibility thereof (see, for example, Pamphlet of WO 02/104080); an organic EL device made of a host material capable of maintaining both of injection and recombination of holes and electrons, a first dopant capable of accepting recombination energy in the host material, and a second dopant capable of trapping holes from the host material (see, for example, Japanese Patent Application Laid-Open (JP-A) No. 2002-038140); an organic EL device including a host compound and a single aromatic polycyclic hydrocarbon compound and a fluorescent dye (see, for example, JP-A No. 2000-106277); an organic EL device wherein two or more condensed aromatic dopants are used (see, for example, Japanese Patent No. 3509746); an organic EL device having a first dopant and a second dopant which gives a longer wavelength than the first dopant (see, for example, JP-A No. 9-134786); a blue-light emitting organic EL device including at least two dopants, at least one of which is smaller in affinity level than a host (see, for example, JP-A No. 2004-171828); and an organic EL device including a blue dopant and a warm color dopant wherein the amount of the warm color dopant is such a level that light is not emitted therefrom (see, for example, JP-A No. 2004-221045).

As described above, the techniques of incorporating a dopant into an organic emitting layer are very important for improving the emission efficiency of an organic EL device and improving the emission lifetime thereof. Thus, various improvements have been made.

However, it cannot be said that organic EL devices having a sufficient efficiency and lifetime have been developed.

In light of the above-mentioned problems, an object of the invention is to provide an organic electroluminescent device having a particularly long lifetime.

SUMMARY OF THE INVENTION

The inventors have repeated investigations on the above-mentioned problems, so as to find out that: in an organic EL device as described above, carries (holes and electrons) which do not contribute to recombination pass through its organic emitting layer so as to be injected into charge-transporting layers at the reverse sides, so that the durability of the device lowers; and the lifetime of an organic EL device can be improved by causing a hole-trapping dopant and an electron-trapping dopant to be together present in its organic emitting layer. Thus, the invention has been made.

The invention provides the following organic EL device.

1. An organic electroluminescent device comprising: an anode, a cathode and an organic emitting layer held therebetween, the organic emitting layer containing one or more host materials, a hole trapping dopant and an electron trapping dopant.
2. The organic electroluminescent device according to 1 which satisfies the following formulas:

$Ihh-Ihd \geqq 0.2$ eV and, $Aed-Aeh \geqq 0.2$ eV wherein Ihh is the ionization potential of a host material containing the hole trapping dopant, Ihd is the ionization potential of the hole trapping dopant, Aed is the affinity level of the electron trapping dopant and Aeh is the affinity level of a host material containing the electron trapping dopant.
3. The organic electroluminescent device according to 2 which satisfies the following formula, $Ihh-Ahh > Ihd-Ahd \geqq 2.7$ eV wherein Ihh is the ionization potential of the host material containing the hole trapping dopant, Ahh is the affinity level of the host material containing the hole trapping dopant, Ihd is the ionization potential of the hole trapping dopant and Ahd is the affinity level of the hole trapping dopant.
4. The organic electroluminescent device according to 3 which satisfies the following formula, $Ieh-Aeh > Ied-Aed \geqq 2.7$ eV wherein Ieh is the ionization potential of the host material containing the electron trapping dopant, Aeh is the affinity level of the host material containing the electron trapping dopant, Ied is the ionization potential of the electron trapping dopant and Aed is the affinity level of the electron trapping dopant.
5. The organic electroluminescent device according to 4 which satisfies the following formulas:

$Ihh-Ahh > 2.9$ eV and, $Ieh-Aeh > 2.9$ eV wherein Ihh is the ionization potential of the host material containing the hole trapping dopant, Ahh is the affinity level of the host material containing the hole trapping dopant, Ieh is the ionization potential of the host material containing the electron trapping dopant and Aeh is the affinity level of the host material containing the electron trapping dopant.

6. The organic electroluminescent device according to 5 which satisfies the following formula, $$Ieh-Ied<0.2\ eV$$

wherein Ieh is the ionization potential of the host material containing the electron trapping dopant and Ied is the ionization potential of the electron trapping dopant.

7. The organic electroluminescent device according to 6, wherein the host material containing the hole trapping dopant is nearer to the anode than the host material containing the electron trapping dopant.

8. The organic electroluminescent device according to 6 or 7, wherein the host material containing the hole trapping dopant and/or the host material containing the electron trapping dopant are/is one or more compounds represented by the following formula (1),

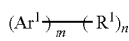 (1)

wherein $Ar^1$ is an aromatic ring with 6 to 30 nucleus carbon atoms or an hetero aromatic ring with 5 to 20 nucleus carbon atoms, $R^1$ is a substituent, m is an integer of 1 to 6, n is an integer of 0 to 30, $Ar^1$s may be the same as or different from each other when m is 2 or more, and $R^1$s may be the same as or different from each other when n is 2 or more.

9. The organic electroluminescent device according to 6 or 7, wherein the hole trapping dopant is an aromatic amine derivative containing a condensed ring.

10. The organic electroluminescent device according to 6 or 7, wherein the hole trapping dopant is a compound represented by the following formula (2),

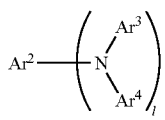 (2)

wherein $Ar^2$ to $Ar^4$ are a substituted or unsubstituted aromatic ring with 6 to 50 nucleus carbon atoms or a substituted or unsubstituted hetero aromatic ring with 5 to 50 nucleus carbon atoms, l is an integer of 1 to 4, $Ar^3$s may be the same or different and $Ar^4$ may be the same or different when l is 2 or more, and at least one of $Ar^2$ to $Ar^4$ has a substituted or unsubstituted condensed aromatic rings with 10 to 50 nucleus carbon atoms or a styryl group.

11. The organic electroluminescent device according to 10, wherein the hole trapping dopant is a compound represented by the formula (2) wherein at least one of $Ar^2$ to $Ar^4$ is a substituted or unsubstituted condensed-aromatic-ring with 10 to 50 nucleus carbon atoms or a styryl-substituted aromatic ring with 6 to 50 nucleus carbon atoms.

12. The organic electroluminescent device according to 6 or 7, wherein the electron trapping dopant is a compound represented by the following formula (3)

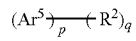 (3)

wherein $Ar^5$ is an aromatic ring with 14 to 50 nucleus carbon atoms or a hetero aromatic ring with 5 to 50 nucleus carbon atoms, $R^2$ is a substituent, p is an integer of 1 to 6, q is an integer of 0 to 30, $Ar^5$s may be the same as or different from each other when p is 2 or more, and $R^2$S may be the same as or different from each other when q is 2 or more.

13. A display comprising the organic electroluminescent device of any one of 1 to 12.

The lifetime and luminous efficiency of the organic electroluminescent device of the invention can be improved by making a hole-trapping dopant and an electron-trapping dopant to be present together in its organic emitting layer.

DESCRIPTION OF THE PREFERRED EMBODIMENTS

Referring to the attached drawings, the organic electroluminescent device of the invention will be specifically described hereinafter.

First Embodiment

Figure 1:
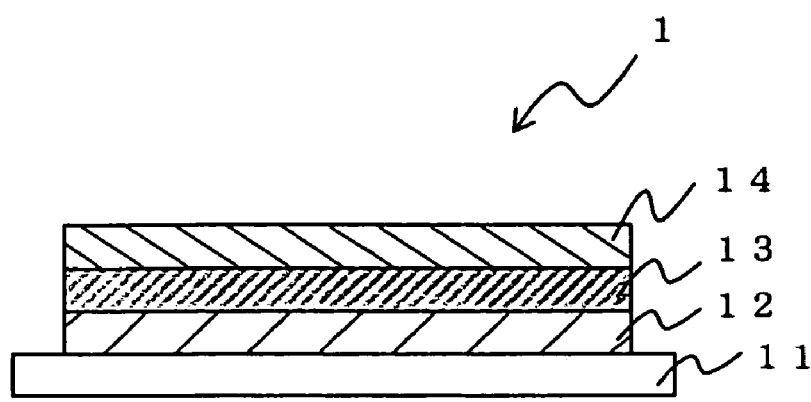
FIG. 1 is a schematic sectional view of an organic electroluminescent device which is a first embodiment of the invention.

FIG. 1 is a schematic sectional view of an organic electroluminescent device which is a first embodiment of the invention.

The organic electroluminescent device 1 has a structure in which an anode 12, an organic emitting layer 13, and a cathode 14 are stacked, in this order, on a substrate 11. In this device, a voltage is applied thereto across the anode 12 and the cathode 14, whereby holes and electrons are injected from the anode 12 and the cathode 14, respectively, to the organic emitting layer 13. These are recombined in the organic emitting layer 13 to emit light.

In the embodiment, the organic emitting layer 13 is composed of a hole trapping dopant, an electron trapping dopant, a host material containing the hole trapping dopant, and a host material containing the electron trapping dopant.

Figure 2:
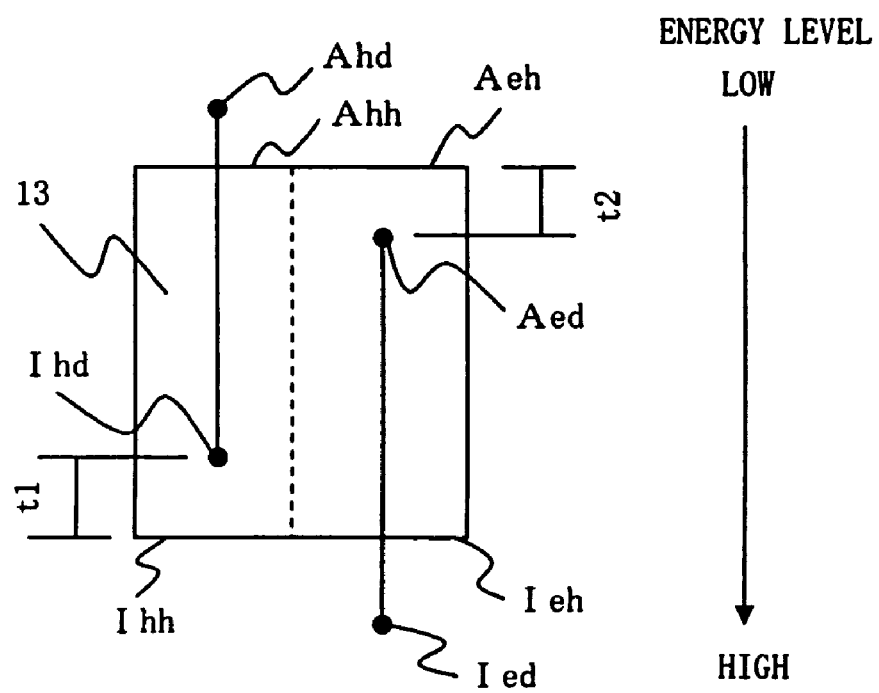
FIG. 2 is an energy diagram of the organic electroluminescent device of the first embodiment.

FIG. 2 is an energy diagram of the organic electroluminescent device of the embodiment.

In this energy diagram are shown energy levels (ionization potentials and affinity levels) of the organic emitting layer 13 (the two host materials), the hole trapping dopant, and the electron trapping dopant, using a vacuum level (not illustrated) as a reference level. Ihh represents the ionization potential of the host material constituting the organic emitting layer 13 and containing the hole trapping dopant; Ahh represents the affinity level of the same; Ieh represents the ionization potential of the host material containing the electron trapping dopant; and Aeh represents the affinity level of the same.

Ihd represents the ionization potential of the hole trapping dopant; Ahd represents the affinity level of the same; Ied represents the ionization potential of the electron trapping dopant; and Aed represents the affinity level of the same. In the figure, an arrow represents a direction toward a higher energy level.

In the invention, the hole trapping dopant means a dopant giving an energy level difference of 0.2 eV or more between the ionization potential Ihh of the host material in the organic emitting layer 13 and the ionization potential Ihd of the present dopant (the difference=Ihh−Ihd=t1 in FIG. 2). When the dopant having a t1 of 0.2 eV or more is added to the host material, holes injected from the anode 12 to the organic emitting layer 13 are effectively trapped by the dopant. Therefore, the amount of the holes which are not consumed in the organic emitting layer 13 can be reduced. The energy level difference t1 is preferably 0.3 eV or more.

The electron trapping dopant means a dopant giving an energy level difference of 0.2 eV or more between the affinity level Aed of the electron trapping dopant and the affinity level Ahh of the host material in the organic emitting layer 13 (the difference=Aed−Ahh=t2 in FIG. 2). When the dopant having a t2 of 0.2 eV or more is added to the host material, electrons injected from the cathode 14 to the organic emitting layer 13 are effectively trapped by the dopant. Therefore, the amount of the electrons which are not consumed in the organic emitting layer 13 can be reduced. The energy level difference t2 is preferably 0.3 eV or more.

In the embodiment, the two host materials are incorporated into the organic emitting layer 13. However, the invention is not limited to this embodiment, and thus two or more host materials may be used or only one host material may be used.

When the organic emitting layer 13 contains two or more host materials, a hole trapping dopant or electron trapping dopant may be added to at least one of the host materials used.

For example, it is sufficient that a hole trapping dopant exhibits hole trapping property to a host material containing the hole trapping dopant (Ihh−Ihd=t1 in FIG. 2 is 0.2 eV or more, preferably 0.3 eV or more) but it is unnecessary that the hole trapping dopant exhibits hole trapping property to any host material containing an electron trapping dopant.

Similarly, it is sufficient that an electron trapping dopant exhibits electron trapping property to a host material containing the electron trapping dopant (Aed−Aeh=t2 in FIG. 2 is 0.2 eV or more, preferably 0.3 eV or more) but it is unnecessary that the electron trapping dopant exhibits electron trapping property to any host material containing a hole trapping dopant.

Figure 3:
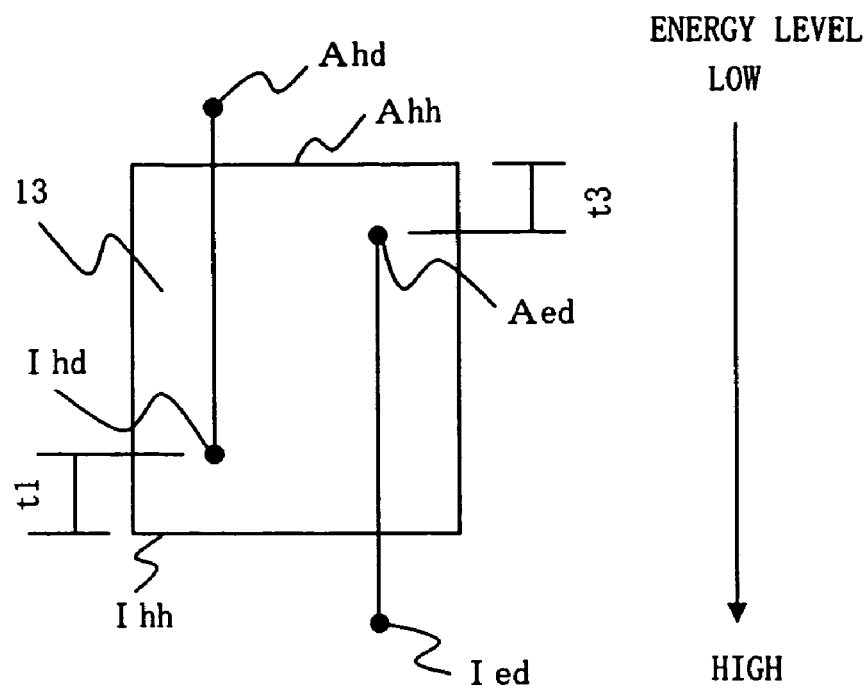
FIG. 3 is an energy diagram of an organic electroluminescent device wherein two host materials are used.

FIG. 3 is an energy diagram in the case that a single host material is used in the organic emitting layer 13.

Ihh represents the ionization potential of the organic emitting layer 13 (the host material), and Ahh represents the affinity level of the same. Others are the same as in FIG. 2.

In the case that the single host material is used, the host material containing a hole trapping dopant is identical with the host material containing an electron trapping dopant. Accordingly, Aed−Aeh (=t2) in FIG. 2 is equal to Aed−Ahh (=t3), and t3 is 0.2 eV or more, preferably 0.3 eV or more.

Second Embodiment

In the organic electroluminescent device of the invention, its organic emitting layer may have a stack structure.

Figure 4:
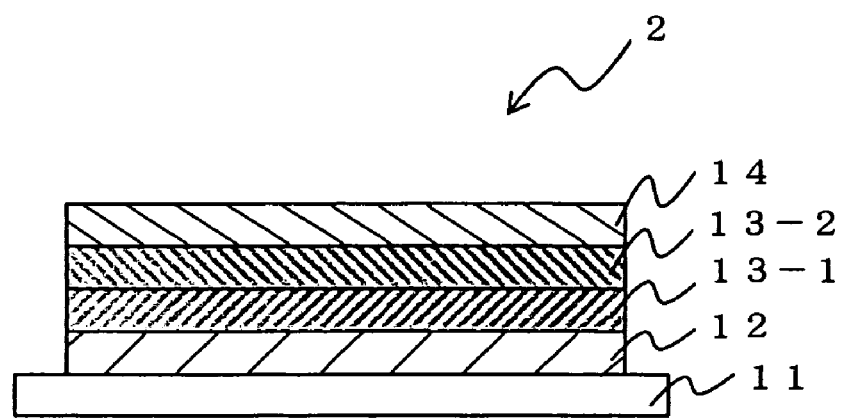
FIG. 4 is a schematic sectional view of an organic electroluminescent device which is a second embodiment of the invention.

FIG. 4 is a schematic sectional view of an organic electroluminescent device which is a second embodiment of the invention.

The organic electroluminescent device 2 has a structure wherein an anode 12, a first organic emitting layer 13-1, a second organic emitting layer 13-2 and a cathode 14 are stacked, in this order, on a substrate 11. When a voltage is applied to this device across the anode 12 and the cathode 14, holes and electrons are injected from the anode 12 and the cathode 14, respectively, to the first organic emitting layer 13-1 and the second organic emitting layer 13-2 so that these are recombined in the first and second organic emitting layers to emit light.

In the embodiment, the first organic emitting layer 13-1 is made of a first host material and a hole trapping dopant, and the second organic emitting layer 13-2 is made of a second host material and an electron trapping dopant. The first host material and second host material may be made of the same compound.

Figure 5:
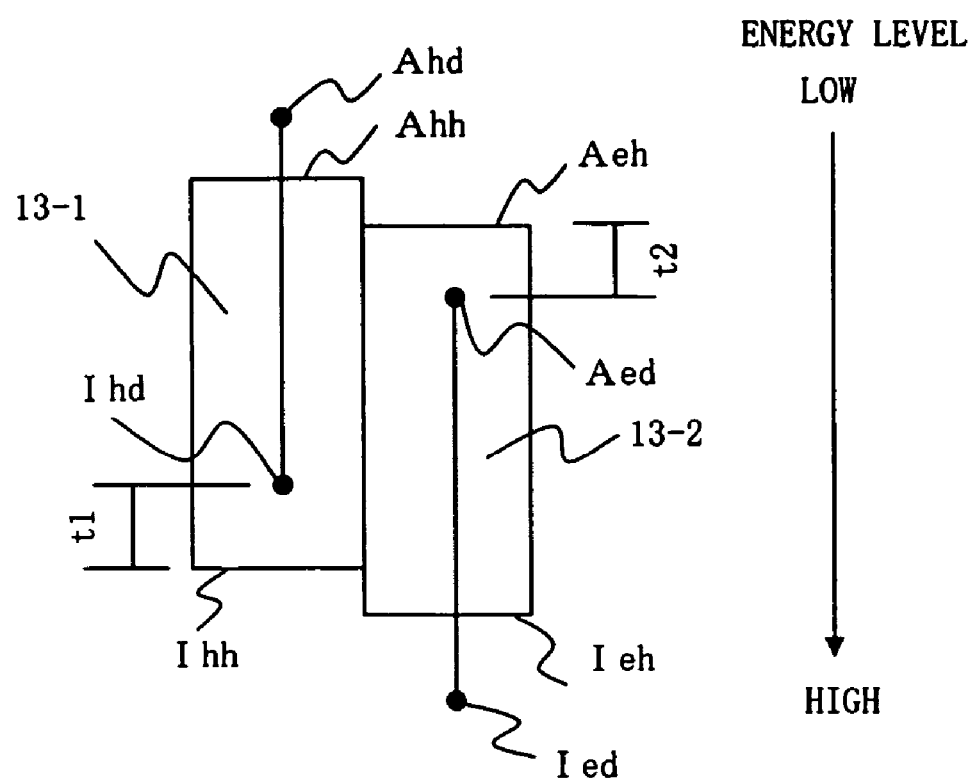
FIG. 5 is an energy diagram of the organic electroluminescent device of the second embodiment.

FIG. 5 is an energy diagram of the first and second organic emitting layers.

In this energy diagram are shown energy levels (ionization potentials and affinity levels) of the first host material constituting the first organic emitting layer 13-1, the hole trapping dopant, the second host material constituting the second organic emitting layer 13-2, and the electron trapping dopant. Reference numbers in this figure are the same as in FIG. 2.

In the embodiment, the first organic emitting layer 13-1 is formed near the anode 12, and the second organic emitting layer 13-2 is formed near the cathode 14. However, the invention is not limited to this structure, and the second organic emitting layer 13-2 may be formed near the anode 12, and the first organic emitting layer 13-1 may be formed near the cathode 14. It is preferred that the first organic emitting layer 13-1 is present nearer to the anode 12 than the second organic emitting layer 13-2, as seen in the present embodiment.

In the case that the organic emitting layer does not have such a bi-layered structure as in the embodiment, it is likewise preferred that the host containing the hole trapping dopant is present near the interface between the emitting layer and the hole-transporting layer and the host containing the electron trapping dopant is present near the interface between the emitting layer and the electron-transporting layer.

Further, the organic emitting layer has the two-layer stacked structure, but a stack structure of three or more organic emitting layers may be used. In this case, at least one of the organic emitting layers should have both of a hole trapping dopant and an electron trapping dopant, or at least two of the organic emitting layers should have a hole trapping dopant or an electron trapping dopant, respectively.

In the organic electroluminescent device of the invention, a hole trapping dopant and an electron trapping dopant are caused to exist together in its organic emitting layer, as seen in the above-mentioned embodiment. This can cause carriers to be effectively trapped by the dopants, so as to lower the possibility that the carriers pass through the organic emitting layer to reach the charge-transporting layers at the opposite sides, in particular, so as to hinder the electrons from going into the hole trapping dopant. It is presumed that this matter makes it possible to make the lifetime of the organic electroluminescent device longer.

In the organic electroluminescent device of the invention, it is preferred that the energy level difference between the ionization potential Ihh of the host material containing the hole trapping dopant and the affinity level Ahh of the same (Ihh–Ahh) and the energy level difference between the ionization potential Ihd of the hole trapping dopant and the affinity level Ahd of the same (Ihd–Ahd) satisfy the following relationship:

$Ihh-Ahh > Ihd-Ahd \geq 2.7$ eV.

Similarly, it is preferred that the energy level difference between the ionization potential Ieh of the host material containing the electron trapping dopant and the affinity level Aeh of the same (Ieh–Aeh) and the energy level difference between the ionization potential Ied of the electron trapping dopant and the affinity level Aed of the same (Ied–Aed) satisfy the following relationship:

$Ieh-Aeh > Ied-Aed \geq 2.7$ eV.

When the above-mentioned relationships are satisfied, the host containing the hole trapping dopant and the host containing the electron trapping dopant each give a broad energy gap. Consequently, a desired combination of the dopants makes it possible to emit light rays from blue color to red color. In particular, in the case that blue light is desired to be obtained, it is necessary to satisfy the above-mentioned relationships.

In the organic electroluminescent device of the invention, it is particularly preferred that the energy level difference between the ionization potential Ihh of the host material containing the hole trapping dopant and the affinity level Ahh of the same (Ihh–Ahh) and the energy level difference between the ionization potential (Ieh) of the host material containing the electron trapping dopant and the affinity level (Aeh) of the same (Ieh–Aeh) satisfy the following relationships:

$Ihh-Ahh > 2.9$ eV, and $Ieh-Aeh > 2.9$ eV.

When the energy level difference between the ionization potential and the affinity level of each of the host material containing the hole trapping dopant and the host material containing the electron trapping dopant is larger than 2.9 eV described above, blue luminescence having a higher color purity can be obtained.

It is preferred that the energy level difference between the ionization potential Ieh of the host material containing the electron trapping dopant and the ionization potential Ied of the electron trapping dopant (Ieh–Ied) is less than 0.2 eV.

When this relationship is satisfied, the electron trapping dopant can trap electrons to prevent an excessive amount of electrons not related to recombination from being injected into the hole-transporting layer.

It is preferred that the affinity level Ahh of the host material containing the hole trapping dopant is lower than the affinity level Ahd of the hole trapping dopant. This makes it possible to improve the emission efficiency of the device.

As the host material, the hole trapping dopant and the electron trapping dopant in the organic electroluminescent device of the invention, host materials and dopants which have been hitherto used in organic EL devices can be used if they are selected to satisfy the above-mentioned relationships.

As the host material, an aromatic compound, an amine derivative or a heterocyclic compound is preferably used. Examples thereof include aromatic compounds having anthracene or pyrene as their basic skeleton, dimers and trimers of aromatic amine compounds, and compounds having a carbazole ring.

In the invention, the host material containing the hole trapping dopant and/or the electron trapping dopant is preferably a compound represented by the following formula (1). Each of the hole trapping dopant and the electron trapping dopant is in particular preferably a compound represented by the formula (1).

(1)

wherein $Ar^1$ is an aromatic ring with 6 to 30 nucleus carbon atoms or aromatic heterocyclic group with 5 to 20 nucleus carbon atoms, $R^1$ is a substituent, m is integer of 1 to 6, and n is an integer of 0 to 30, provided that $Ar^1$s may be the same as or different from each other when m is 2 or more, and $R^1$s may be the same as or different from each other when n is 2 or more.

Examples of $Ar^1$ include benzene, naphthalene, phenanthrene, anthracene, benzanthracene, chrysene, pyrene, triphenylene, perylene, naphthacene and fluoranthene.

Specific examples of $R^1$ include substituted or unsubstituted aromatic groups with 6 to 50 nucleus carbon atoms, substituted or unsubstituted aromatic heterocyclic groups with 5 to 50 nucleus carbon atoms, substituted or unsubstituted alkyl groups with 1 to 50 carbon atoms, substituted or unsubstituted alkoxy groups with 1 to 50 carbon atoms, substituted or unsubstituted aralkyl groups with 1 to 50 carbon atoms, substituted or unsubstituted aryloxy groups with 5 to 50 nucleus atoms, substituted or unsubstituted arylthio groups with 5 to 50 nucleus atoms, substituted or unsubstituted carboxyl groups with 1 to 50 carbon atoms, substituted or unsubstituted styryl groups, halogen groups, a cyano group, a nitro group, and a hydroxyl group.

Examples of the substituted or unsubstituted aromatic groups with 6 to 50 nucleus carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, and fluorantenyl groups.

Examples of the substituted or unsubstituted aromatic heterocyclic groups with 5 to 50 nucleus carbon atoms include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

Examples of the substituted or unsubstituted alkyl groups include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, cyclopropyl, cyclobutyl, cyclopentyl, cyclohexyl, 4-methylcyclohexyl, 1-adamanthyl, 2-adamanthyl, 1-norbornyl, and 2-norbornyl groups.

The substituted or unsubstituted alkoxy groups are groups represented by —OY. Examples of Y include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, and 1,2,3-trinitropropyl groups.

Examples of the substituted or unsubstituted aralkyl groups include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl groups.

The substituted or unsubstituted aryloxy groups are represented by —OY'. Examples of Y' include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"'-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8- phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

The substituted or unsubstituted arylthio groups are represented by —SY", and examples of Y" include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

The substituted or unsubstituted carboxyl groups are represented by —COOZ, and examples of Z include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihyroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, and 1,2,3-trinitropropyl groups.

Examples of the divalent groups forming a ring include tetramethylene, pentamethylene, hexamethylene, diphenylmethane-2,2'-diyl, diphenylethane-3,3'-diyl, and diphenylpropane-4,4'-diyl groups.

Examples of the halogen groups include fluorine, chlorine, bromine and iodine.

The substituent $R^1$ is preferably a phenyl, biphenyl, naphtyl, phenanthryl, anthracenyl, pyrenyl and fluorenyl group and the like.

Preferable examples of the compounds represented by formula (1) include bisanthracenes, monoanthracenes, unsymmetric anthracenes and unsymmetric pyrenes shown below.

Bisanthracene $$A^1\text{-L-}A^2 \tag{4}$$

wherein $A^1$ and $A^2$ are independently a substituted or unsubstituted monophenylanthryl or a substituted or unsubstituted diphenylanthryl group and may be the same as or different from each other; and L is a single bond or a divalent linking group.

Examples of the above formula (4) include compounds having the structure shown below.

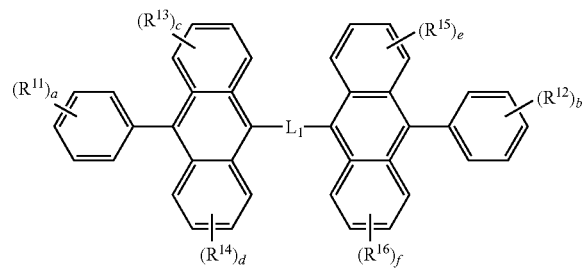

wherein $R^{11}$ to $R^{16}$ are independently an alkyl group, a cycloalkyl group, an alkenyl group, a substituted or unsubstituted aryl group, an alkoxy group, an aryloxy group, an alkylamino group, an arylamino group or a substituted or unsubstituted heterocyclic group; a and b are each an integer of 0 to 5; c, d, e and f are each an integer of 0 to 4; when they are 2 or more, $R^{11}$s, $R^{12}$s, $R^{13}$s $R^{14}$s, $R^{15}$s or $R^{16}$s may be the same or different, or $R^{11}$s, $R^{12}$S, $R^{13}$s, $R^{14}$S, $R^{15}$s or $R^{16}$s may be bonded together to form a ring; and $L^1$ is a single bond, —O—, —S—, —N(R)— (R is an alkyl group or a substituted or unsubstituted aryl group) or an arylene group.

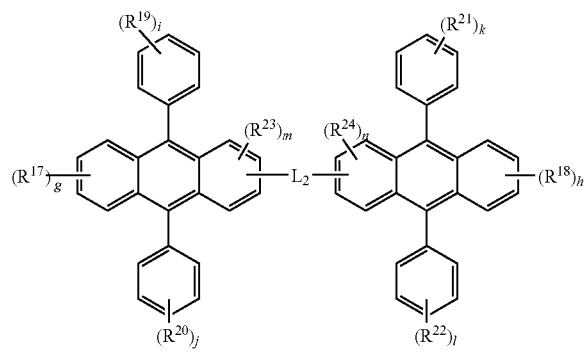

wherein $R^{17}$ to $R^{24}$ are independently an alkyl group, a cycloalkyl group, an alkenyl group, a substituted or unsubstituted aryl group, an alkoxy group, an aryloxy group, an alkylamino group, an arylamino group or a substituted or unsubstituted heterocyclic group; g and h are each an integer of 0 to 4; i, j, k and l are each an integer of 0 to 5; m and n are each an integer of 0 to 3; when they are 2 or more, $R^{17}$s, $R^{18}$s, $R^{19}$s, $R^{20}$s, $R^{21}$s or $R^{22}$s may be the same or different, $R^{17}$s, $R^{18}$s, $R^{19}$s, $R^{20}$s, $R^{21}$s or $R^{22}$s may be bonded together to form a ring; and $L^2$ is a single bond, —O—, —S—, —N(R)— (R is an alkyl group or a substituted or unsubstituted aryl group) or an arylene group. For the details, refer to JP-A-2001-284050.

Monoanthracene $$A^3\text{-An-}A^4 \tag{5}$$

wherein An is a substituted or unsubstituted divalent anthracene residue and $A^3$ and $A^4$ are independently a substituted or unsubstituted monovalent condensed aromatic ring group or a substituted or unsubstitued uncondensed ring aryl group with 12 or more carbon atoms, and may be the same as or different from each other.

In formula (5), $A^3$ and $A^4$ are independently a monovalent residue of a substituted or unsubstitued naphthalene, phenanthrene, fluoranthene, anthracene, pyrene, perylene, coronene, chrysene, picene, fluorene, terphenyl, diphenylanthracene, biphenyl, N-alkyl or arylcarbazole, triphenylene, rubicene, benzoanthracene or dibenzoanthracene group.

For the details, refer to Japanese Patent Application No. 2002-211308.

Unsymmetric Anthracene Compounds

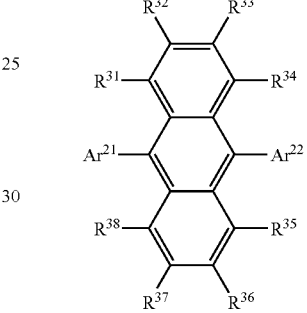

(6)

wherein $Ar^{21}$ and $Ar^{22}$ are independently a substituted or unsubstituted aryl group having 6 to 50 nucleus carbon atoms, provided that $Ar^{21}$ and $Ar^{22}$ do not have the same structure.

$R^{31}$ to $R^{38}$ are independently a substituted or unsubstituted aryl group having 6 to 50 nucleus carbon atoms, a substituted or unsubstituted aromatic heterocyclic group having 5 to 50 nucleus carbon atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus carbon atoms, a substituted or unsubstituted arylthio group having 5 to 50 nucleus carbon atoms, a substituted or unsubstituted alkoxycarbonyl group having 1 to 50 carbon atoms, a carboxyl group, a halogen atom, a cyano group, a nitro group or a hydroxyl group.

Examples of the formula (6) include compounds having the following structure.

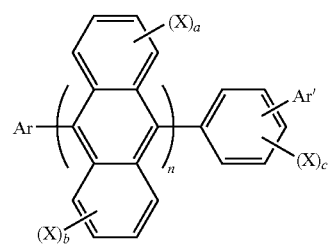

wherein Ar is a substituted or substituted condensed aromatic group having 10 to 50 nucleus carbon atoms, Ar' is a substituted or unsubstituted aryl group having 6 to 50 nucleus carbon atoms, X is a substituted or unsubstituted aryl group having 6 to 50 nucleus carbon atoms, a substituted or unsubstituted aromatic heterocyclic group having 5 to 50 nucleus carbon atoms, a substituted or unsubstituted arkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus carbon atoms, a substituted or unsubstituted arythio group having 5 to 50 nucleus carbon atoms, a substituted or unsubstituted alkoxycarbonyl group having 1 to 50 carbon atoms, a carboxyl group, a halogen atom, a cyano group, a nitro group or a hydroxyl group.

a, b and c are each an integer of 0 to 4 and n is an integer of 1 to 3.

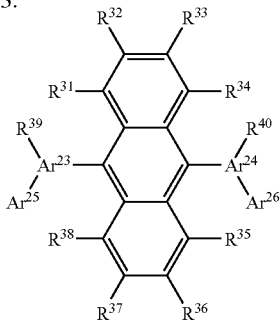

wherein $Ar^{23}$ and $Ar^{24}$ are independently a substituted or unsubstituted condensed aromatic group having 10 to 20 nucleus carbon atoms, $Ar^{25}$ and $Ar^{26}$ are independently a hydrogen atom or a substituted or unsubstituted aryl group with 6 to 50 nucleus carbon atoms, and $R^{31}$ to $R^{40}$ are independently a substituted or unsubstituted aryl group having 6 to 50 nucleus carbon atoms, a substituted or unsubstituted aromatic heterocyclic group having 5 to 50 nucleus carbon atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus carbon atoms, a substituted or unsubstituted arylthio group having 5 to 50 nucleus carbon atoms, a substituted or unsubstituted alkoxycarbonyl group having 1 to 50 carbon atoms, a carboxyl group, a halogen atom, a cyano group, a nitro group or a hydroxyl group, provided that groups do not symmetrically bond to 9 and 10 positions of the central anthracene.

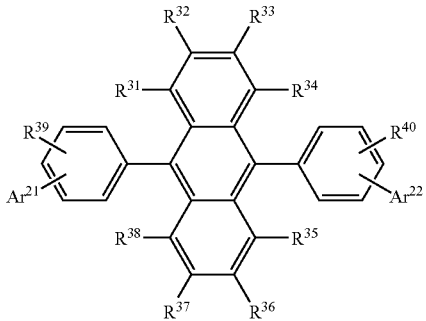

wherein $Ar^{21}$ and $Ar^{22}$ are independently a substituted or unsubstituted aryl group having 6 to 50 nucleus carbon atoms, and $R^{31}$ to $R^{40}$ are independently a substituted or unsubstituted aryl group having 6 to 50 nucleus carbon atoms, a substituted or unsubstituted aromatic hetrocyclic group having 5 to 50 nucleus carbon atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus carbon atoms, a substituted or unsubstituted arylthio group having 5 to 50 nucleus carbon atoms, a substituted or unsubstituted alkoxycarbonyl group having 1 to 50 carbon atoms, a carboxyl group, a halogen atom, a cyano group, a nitro group or a hydroxyl group.

For the details, refer to Japanese Patent Application No. 2004-042694.

Asymmetric Pyrene

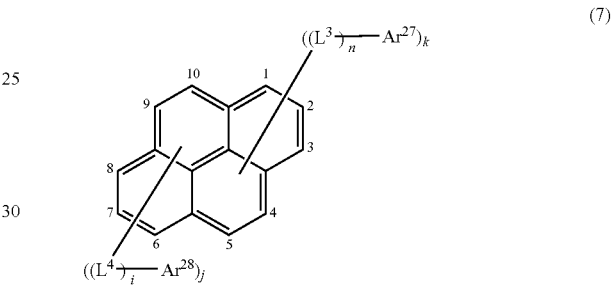

(7)

wherein $Ar^{27}$ and $Ar^{28}$ are each independently a substituted or unsubstituted aromatic group with 6 to 50 nucleus carbon atoms;

$L^3$ and $L^4$ are each independently a substituted or unsubstituted phenylene group, a substituted or unsubstituted naphthalenylene group, a substituted or unsubstituted fluorenylene group, or a substituted or unsubstituted dibenzosilylene;

n is an integer of 0 to 2, k is an integer of 1 to 4, l is an integer of 0 to 2, and j is an integer of 0 to 4; and $L^3$ or $Ar^{27}$ is bonded to any one of the 1 to 5 positions of the pyrene, and $L^4$ or $Ar^{28}$ is bonded to any one of the 6 to 10 positions of the pyrene, provided that when k+j is an even number, $Ar^{27}$, $Ar^{28}$, $L^3$ and $L^4$ satisfy the following (1) or (2):
(1) $Ar^{27} \neq Ar^{28}$ and/or $L^3 \neq L^4$ wherein "≠" means that two groups have different structures, or
(2) when $Ar^{27} = Ar^{28}$ and $L^3 = L^4$,
 (2-1) n≠l and/or k≠j, or
 (2-2) when n=l and k=j,
  (2-2-1) $L^3$ and $L^4$, or pyrene are bonded to different bonding positions on $Ar^{27}$ and $Ar^2$, or
  (2-2-2) $L^3$ and $L^4$, or pyrene are bonded to the same bonding positions on $Ar^{27}$ and $Ar^{28}$, and in this case substitution positions of $L^3$ and $L^4$, or those of $Ar^{27}$ and $Ar^{28}$ on pyrene are neither the 1 and 6 positions, nor the 2 and 7 positions.

Specifically, the compound may be asymmetric pyrene described in Japanese Patent Application No. 2004-157571.

Specific examples of the above-mentioned compound include the following.

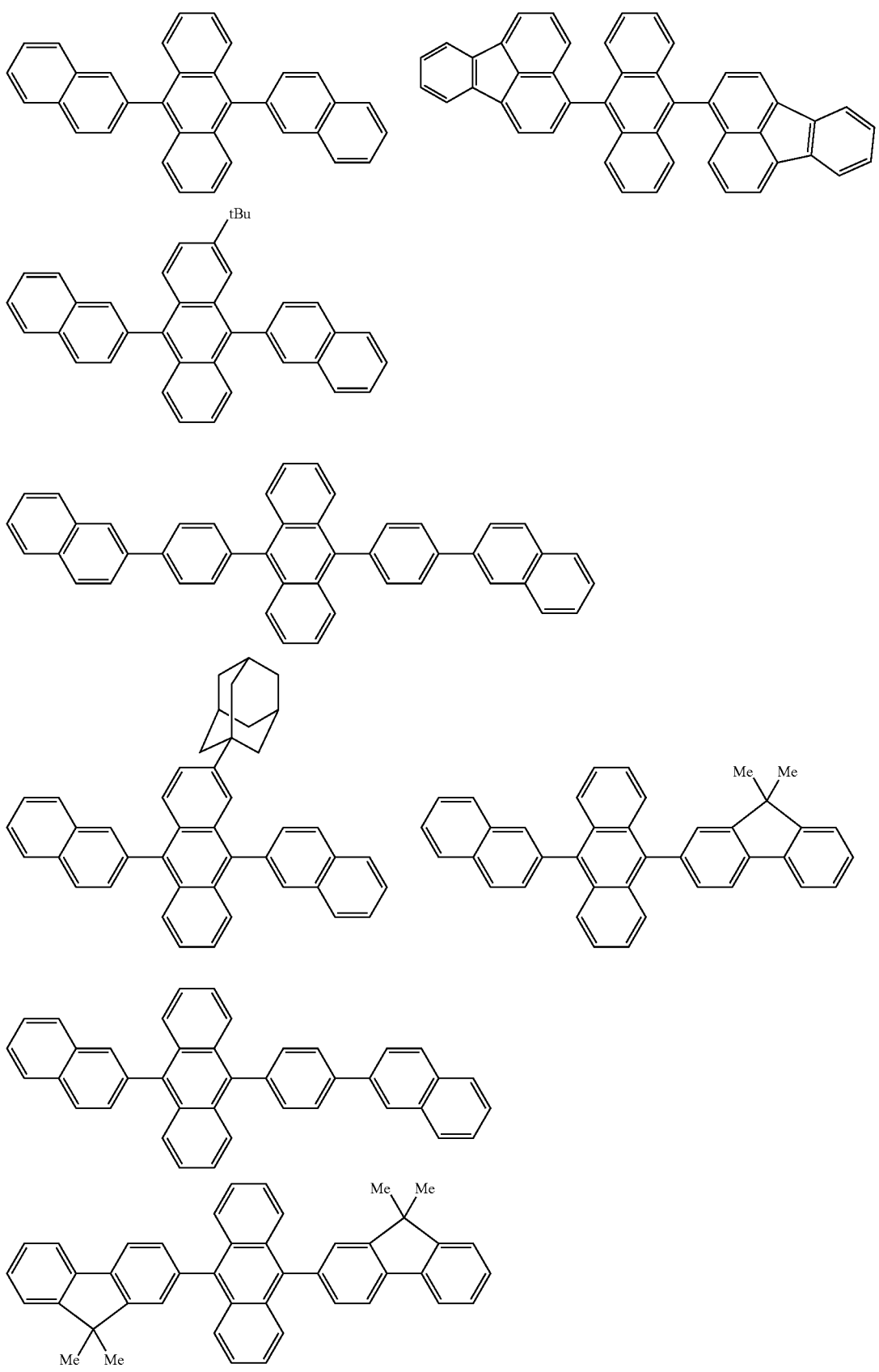

-continued
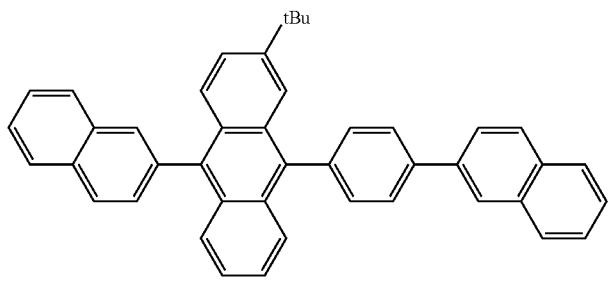
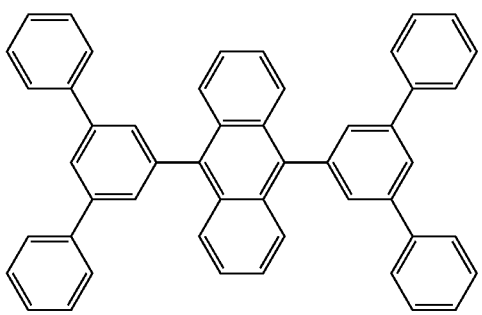
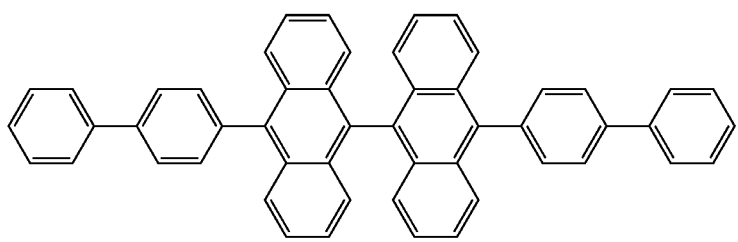
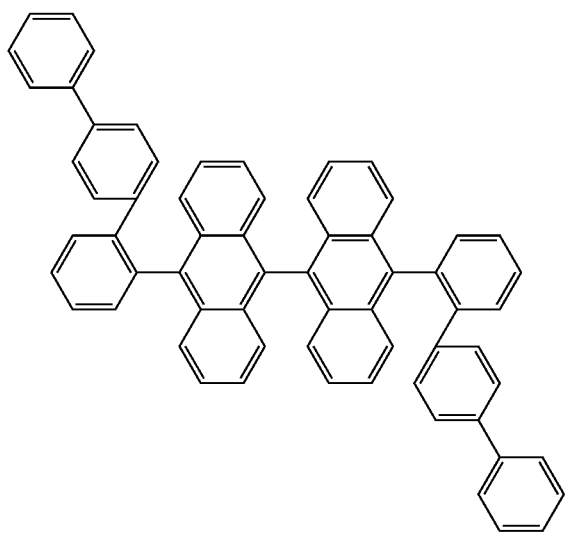
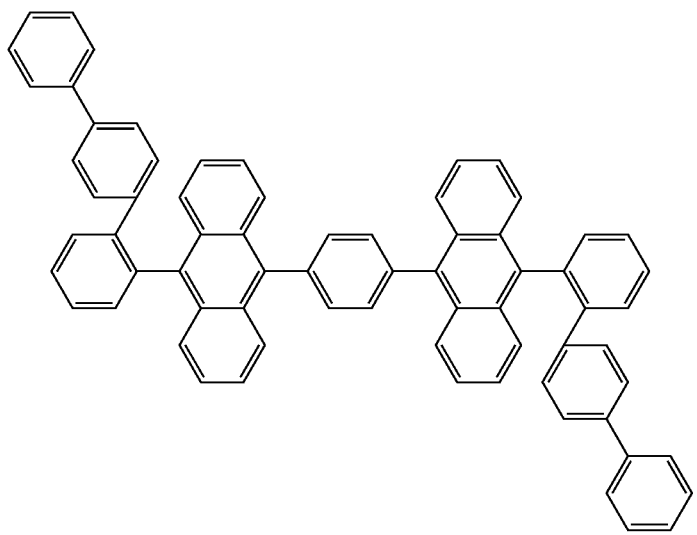

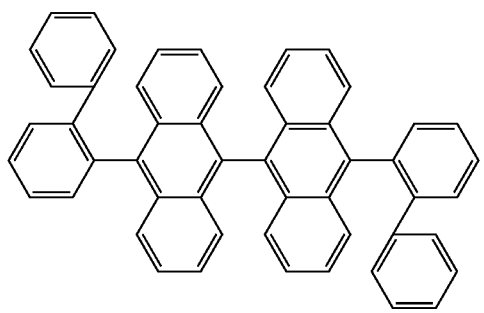

-continued
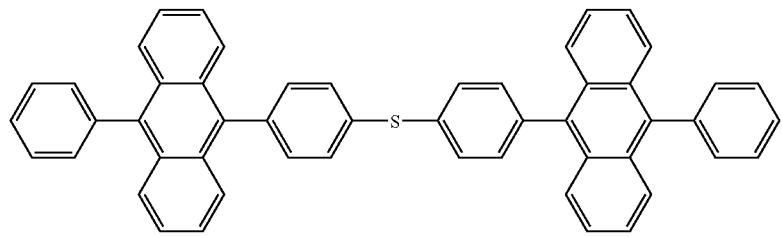
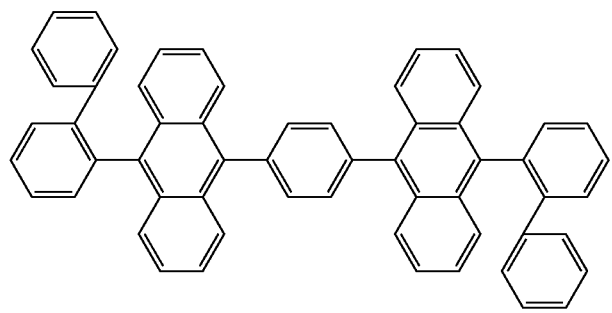
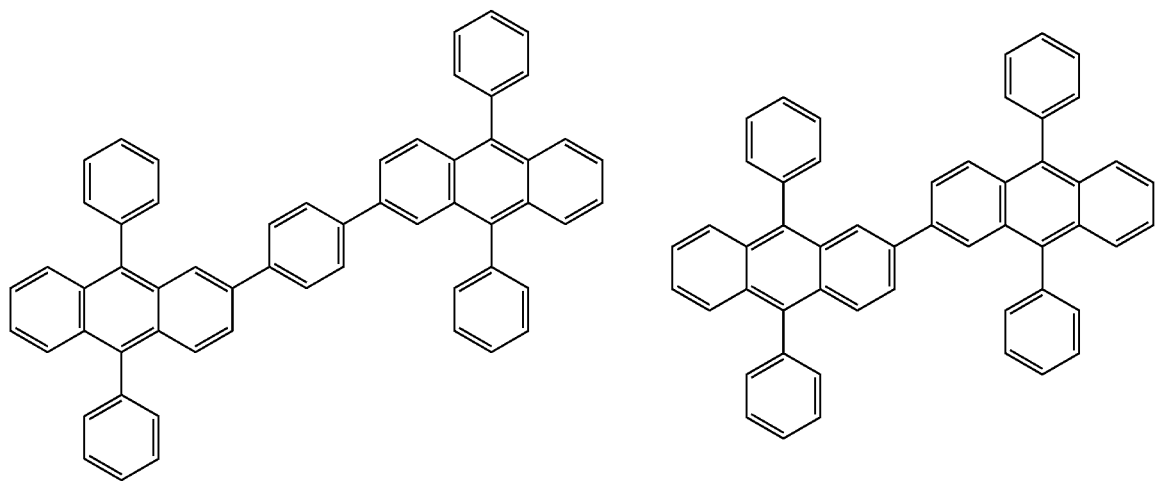
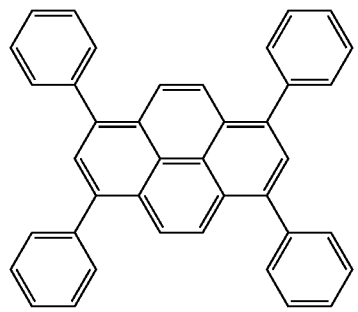
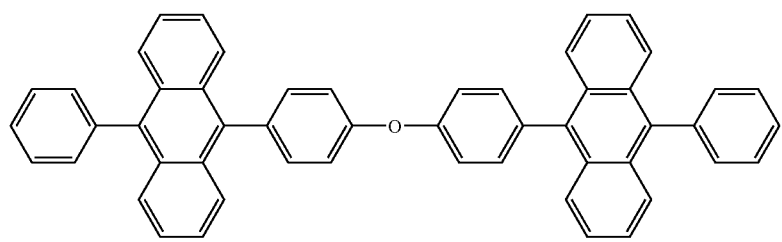

-continued
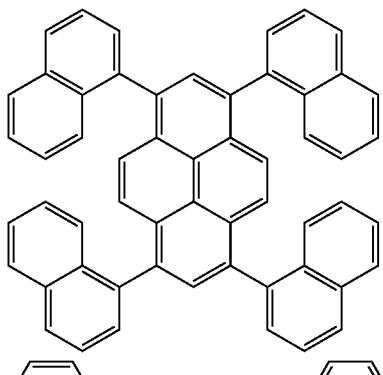
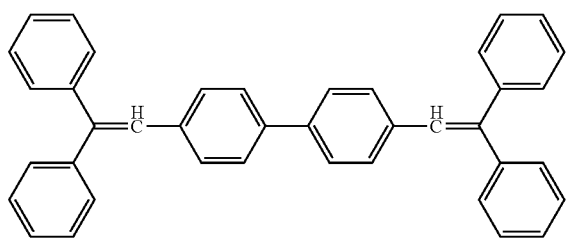
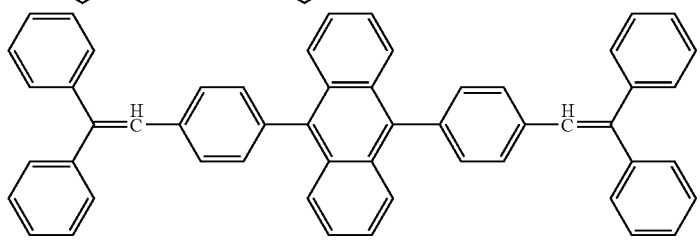
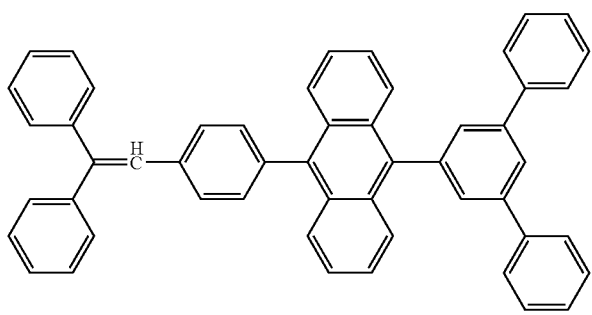
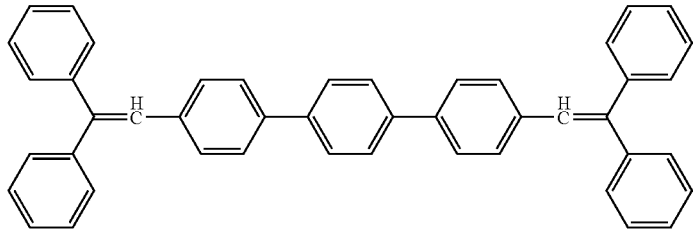
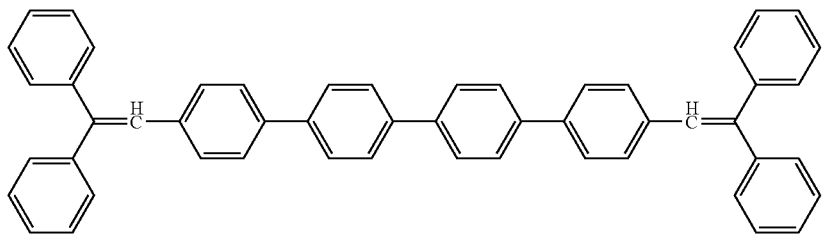
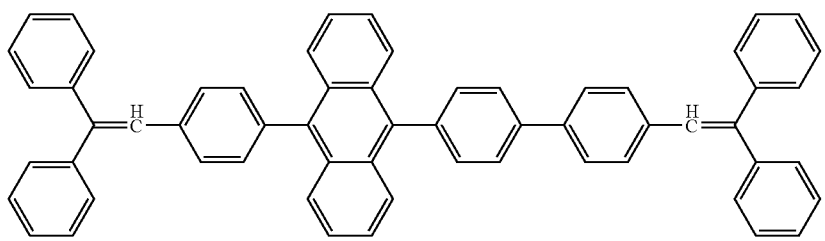

The glass transition temperature of the host material is preferably 100° C. or higher in order to maintain the thermal stability of the organic EL device. The temperature is in particular preferably 120° C. or higher.

Examples of a hole trapping dopant and an electron trapping dopant include arylamine, styrylamine derivatives, aromatic amine compounds such as arylamine-substituted condensed aromatic ring compounds, and condensed aromatic ring compounds.

A hole trapping dopant is preferably aromatic amine derivatives or styrylamine derivatives having condensed rings, since they have relatively small ionization potentials.

Examples of preferred compounds are represented by the following formula (2).

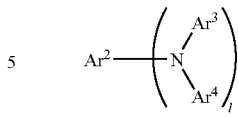

(2)

wherein $Ar^2$ to $Ar^4$ are each a substituted or unsubstituted aromatic ring with 6 to 50 nucleus carbon atoms, or a substituted or unsubstituted heteroaromatic ring with 5 to 50 nucleus carbon atoms; and l is an integer of 1 to 4. $Ar^3$ and $Ar^4$ may be the same as or different from each other when l is 2 or more. At least one of $Ar^2$ to $Ar^4$ has a substituted or unsubstituted condensed aromatic ring with 10 to 50 nucleus carbon atoms or a styryl group.

Specific examples of the compounds of the formula (2) are illustrated below.

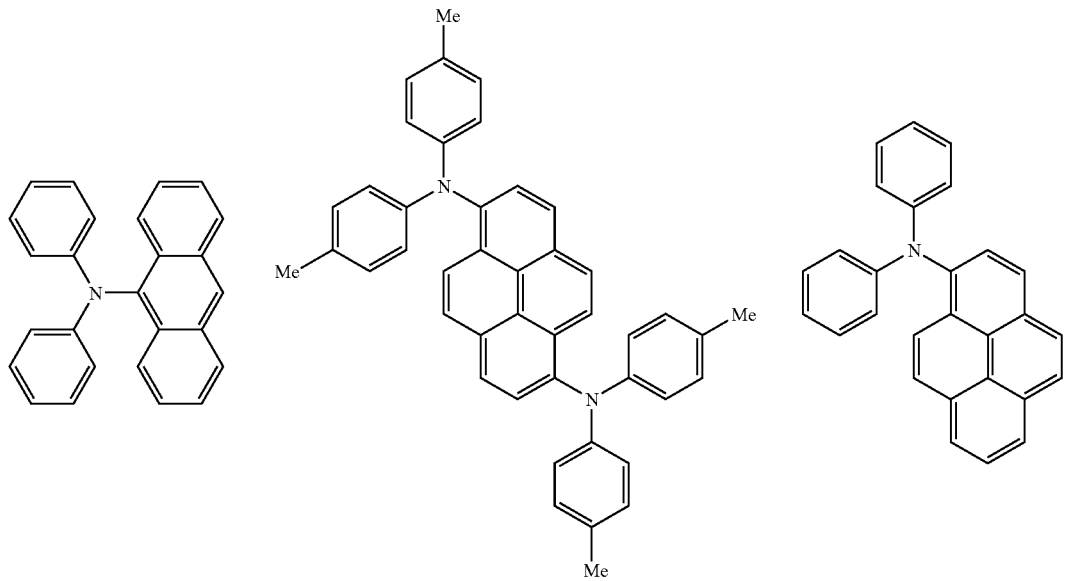

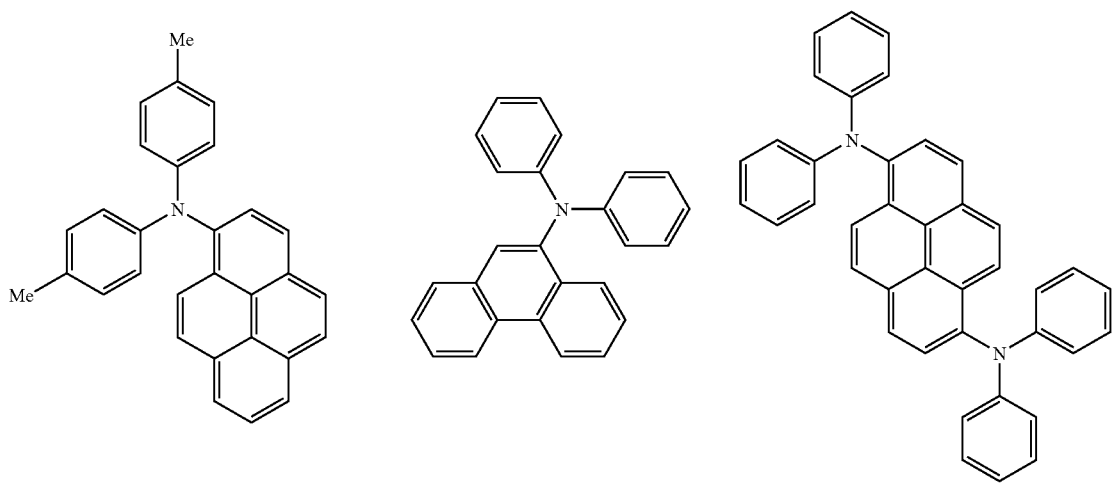

-continued
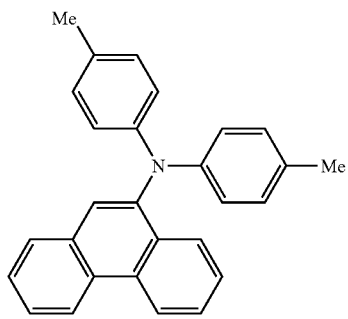
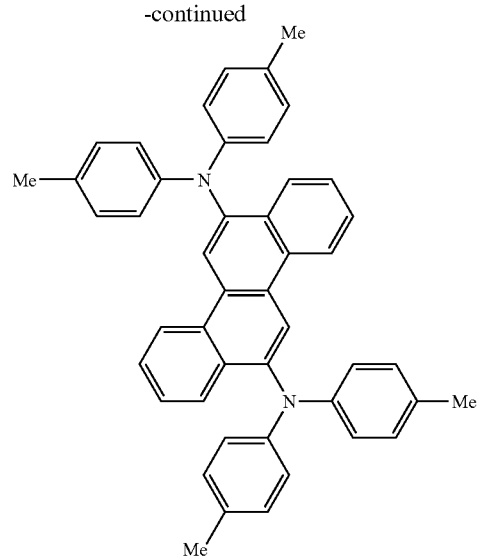
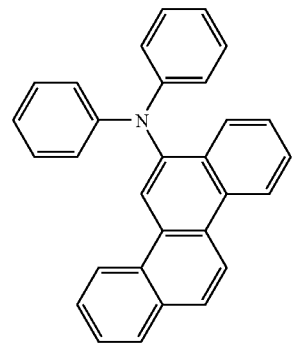
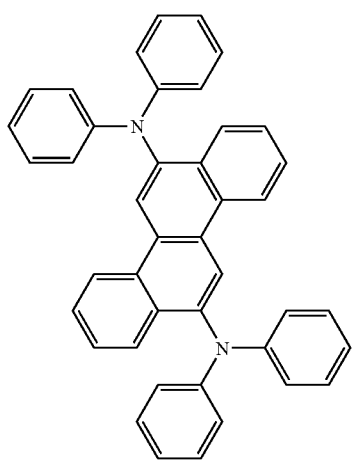
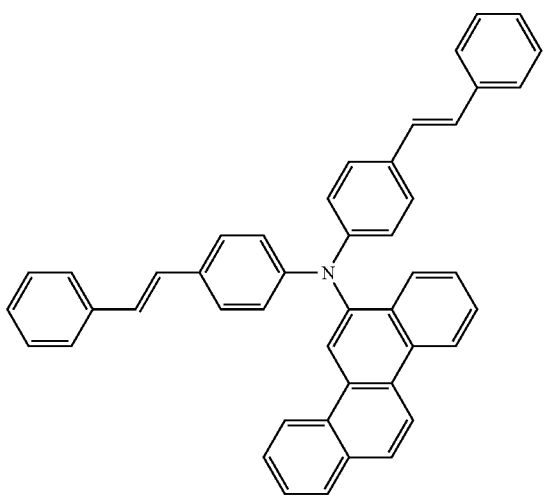
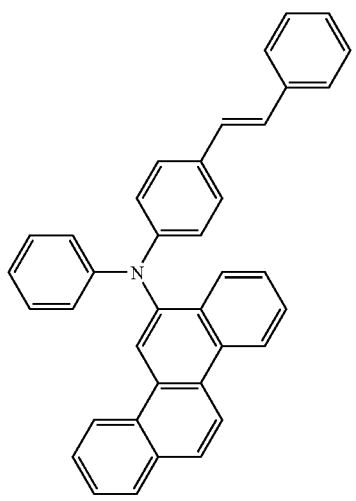
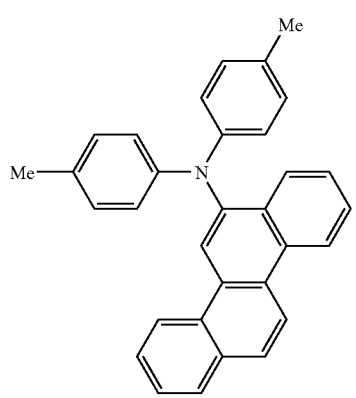

-continued
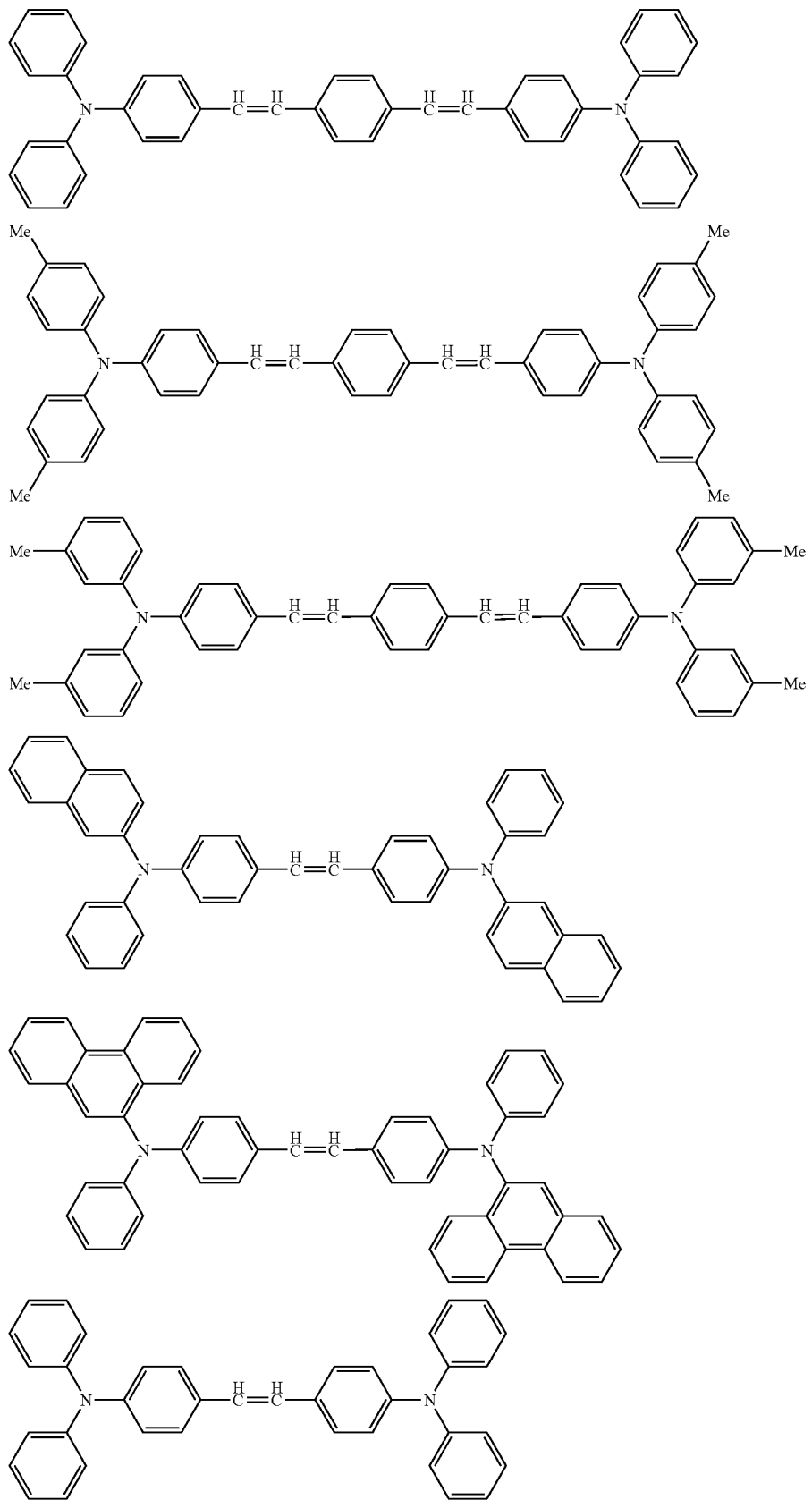

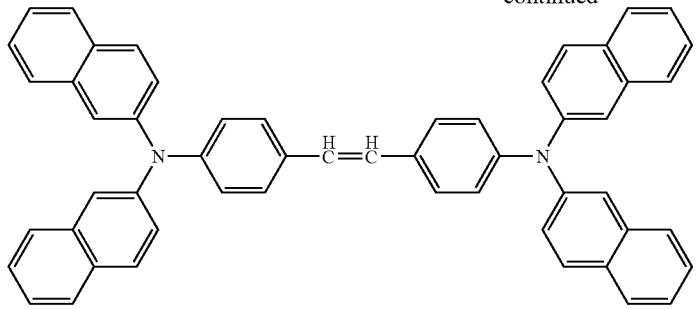

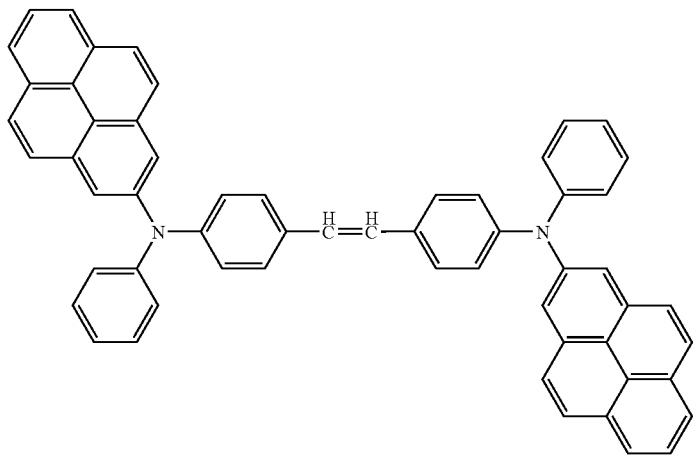

Among these compounds, at least one of $Ar^2$ to $Ar^4$ of the compounds represented by the formula (2) is preferably an aromatic ring with 6 to 50 nucleus carbon atoms having a substituted or unsubstituted condensed aromatic ring with 10 to 50 nucleus carbon atoms or a styryl group as a substituent.

These compounds have an energy level difference of 2.7 eV or more relative to the ionization potential Ihd and the affinity level Ahd of a hole trapping dopant.

An electron trapping dopant is preferably a substituted or unsubstituted condensed aromatic ring compound with 14 to 50 nucleus carbon atoms or a heteroaromatic ring compound with 5 to 50 nucleus carbon atoms since the compounds are stable toward electrons.

Compounds represented by the following formula (3) are exemplified.

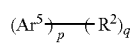 (3)

wherein $Ar^5$ is an aromatic ring with 14 to 50 nucleus carbon atoms or a heteroaromatic ring with 5 to 50 nucleus carbon atoms, $R^2$ is a substituent, p is integer of 1 to 6, and q is an integer of 0 to 30, provided that $Ar^5$s may be the same as or different from each other when p is 2 or more, and $R^2$s may be the same as or different from each other when q is 2 or more.

In the formula, examples of $Ar^5$ include phenanthrene, anthracene, benzanthracene, chrysene, pyrene, triphenylene, benzachrysene, picene, perylene, naphthacene, pentaphene, rubicene, fluoranthene, perifluoranthene, perifranthene, benzoperifranthene, dibenzoperifranthene.

Preferred examples include pyrene, chrysene, perylene, naphthacene, fluoranthene and perifluoranthene.

Examples of $R^2$ are the same as those of $R^1$ of the formula (1).

Examples of the compounds represented by formula (3) are as follows.

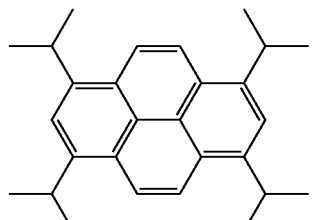

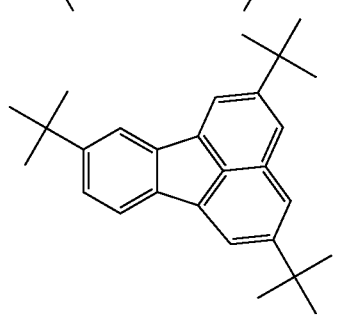

-continued
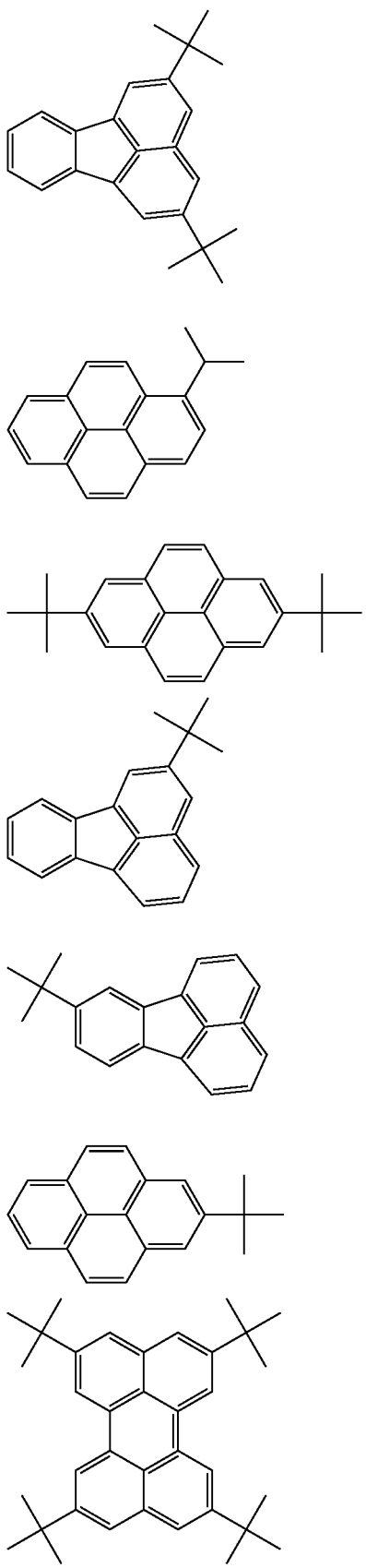
-continued
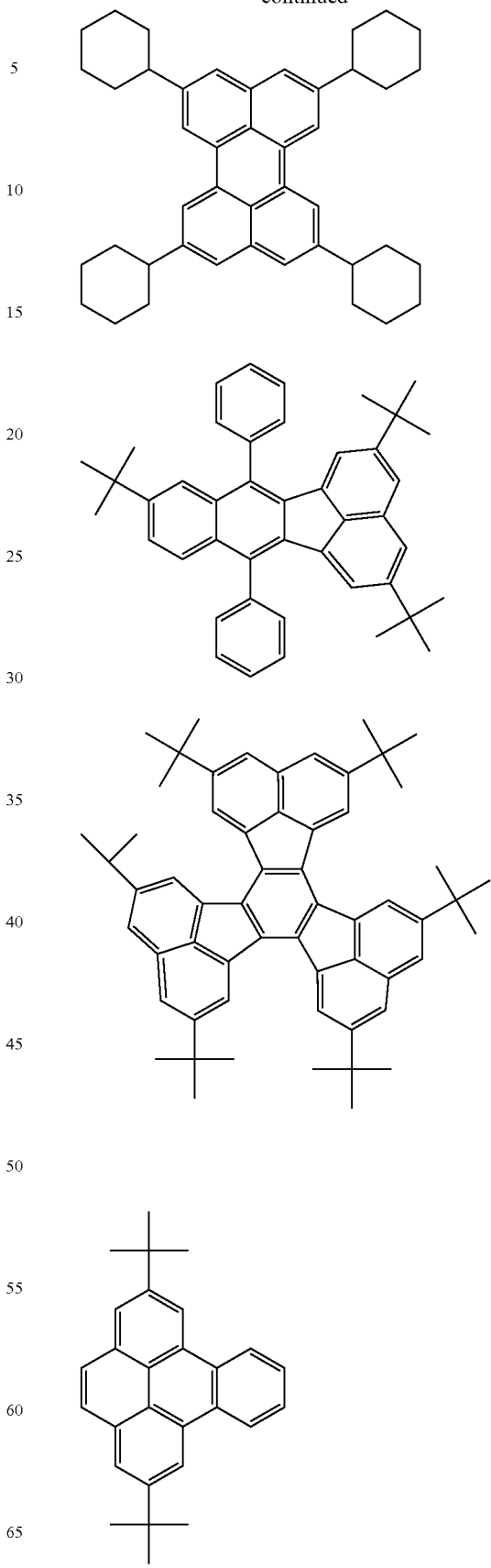

-continued
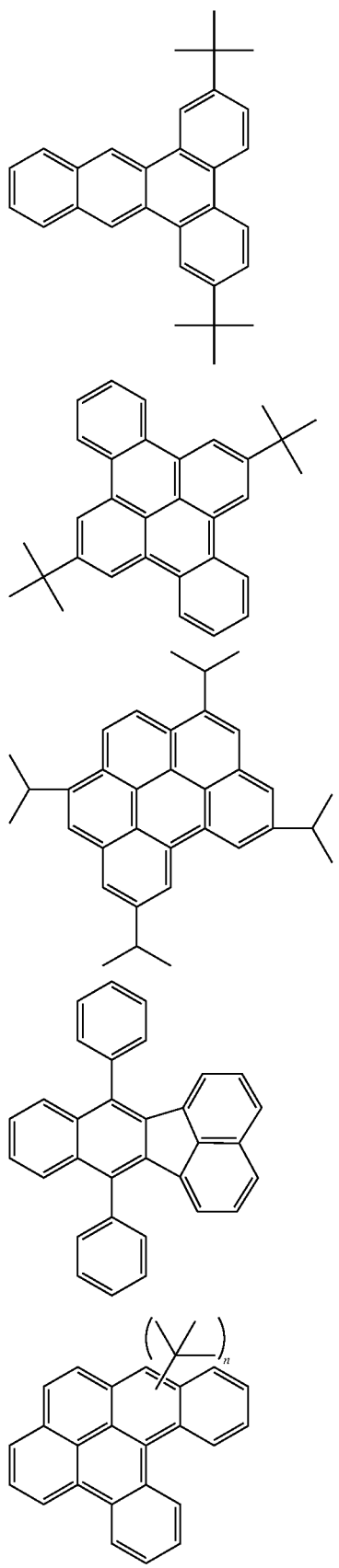
-continued
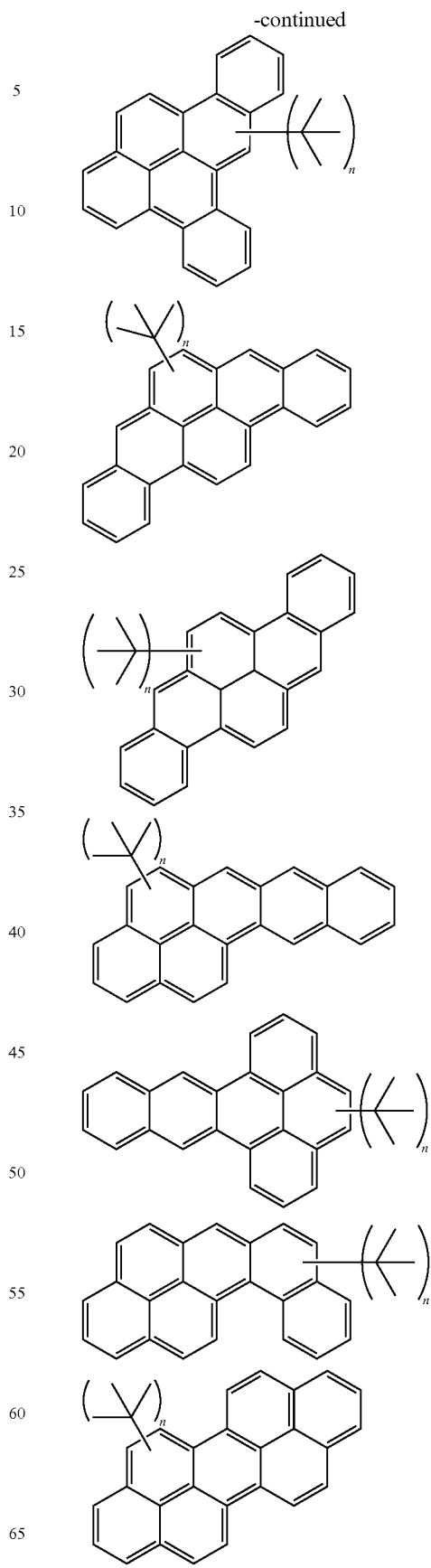

-continued
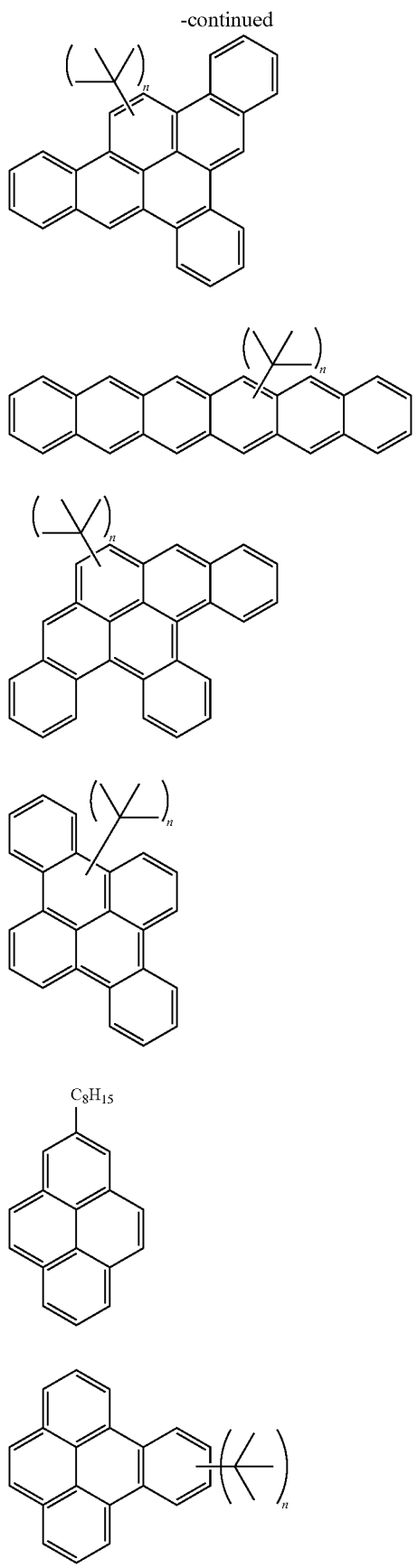
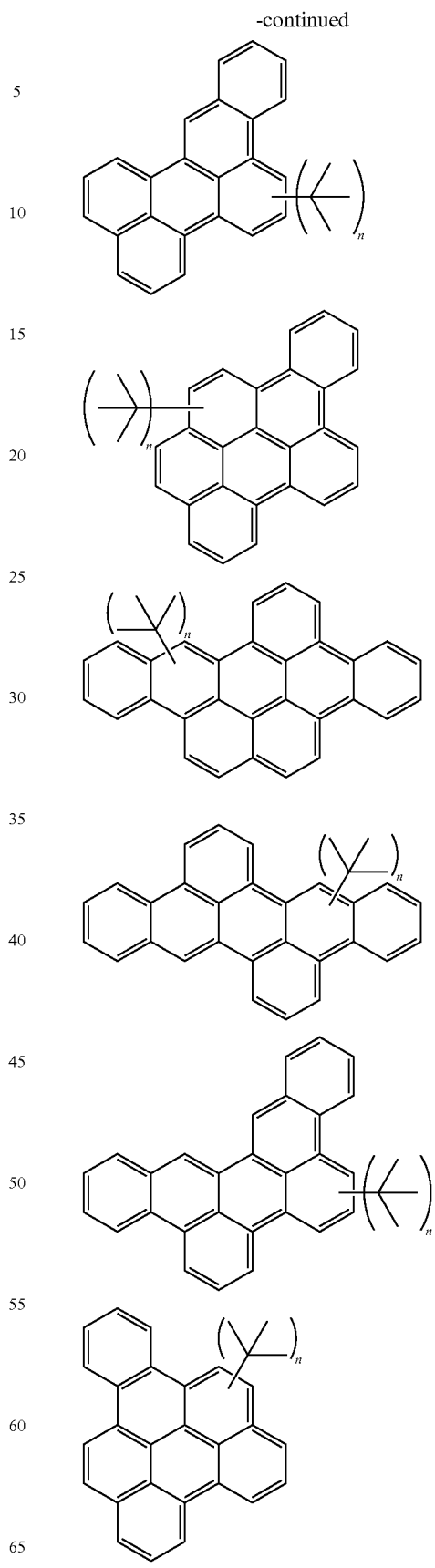

-continued

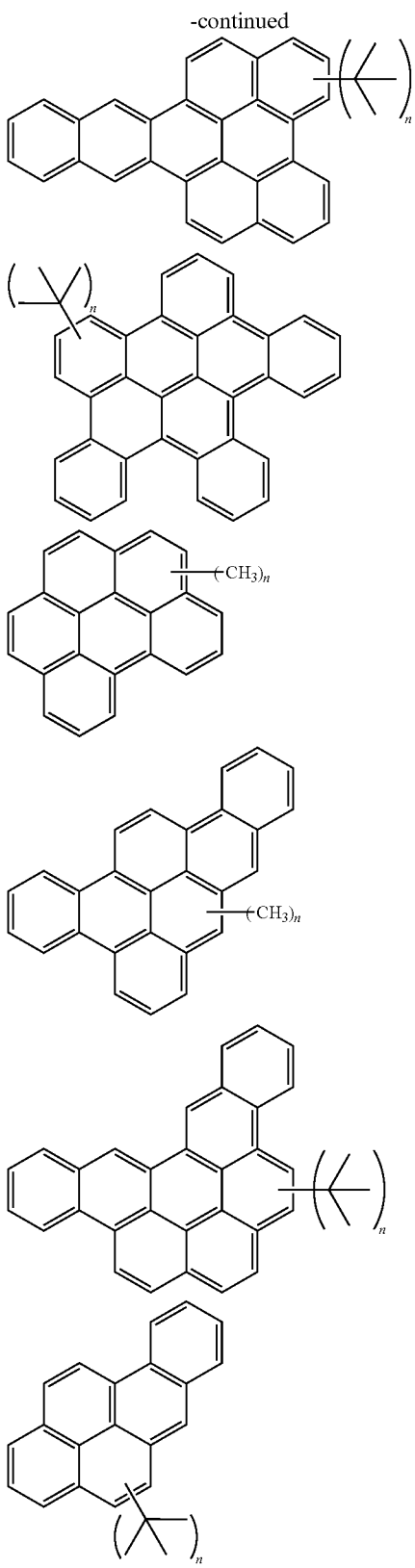

These compounds have an energy level difference of 2.7 eV or more relative to the ionization potential Ied and the affinity level Aed of an electron trapping dopant. In the for-
mulas, n is an integer, which means that the compounds have 0, 1 or 2 and more substituents.

About the method for forming the light emitting layer, the light emitting layer can be formed by making an organic light-emitting material wherein the light-emitting-layer material, the hole trapping dopant and the electron trapping dopant are mixed into a thin film by vacuum deposition, sputtering, spin coating, casting or some other method. The layer is preferably formed by vacuum deposition since a homogeneous film is easily obtained and pinholes are not easily generated.

When the thin film is formed, the light-emitting-layer material, the hole trapping dopant and the electron trapping dopant are preferably mixed into a homogeneous state.

The amounts of the hole trapping dopant and the electron trapping dopant added to the whole of the light emitting layer are each preferably 20% or less by weight, in particular preferably from 1 to 10% by weight. If each of the amounts is more than 20% by weight, the concentration of the dopant is too high so that the luminescent efficiency may lower.

A compound other than the light-emitting-layer material, the hole trapping dopant and the electron trapping dopant may be added to the light emitting layer. For example, a third dopant may be added thereto.

The organic emitting layer, which is a feature of the invention, has been described above. The other constituent elements are not particularly limited, and structures and materials generally used therefore can be used.

As discussed previously, the organic EL device of the invention has an emitting layer between a pair of electrodes.

The specific structure of the organic EL device of the invention include the following:

i) Anode/emitting layer/cathode,
ii) Anode/hole injecting layer/emitting layer/cathode,
iii) Anode/emitting layer/electron injecting layer/cathode,
iv) Anode/hole injecting layer/emitting layer/electron injecting layer/cathode,
v) Anode/organic semiconductor layer/emitting layer/cathode,
vi) Anode/organic semiconductor layer/electron barrier layer/emitting layer/cathode,
vii) Anode/organic semiconductor layer/emitting layer/adhesion improving layer/cathode,
viii) Anode/hole injecting layer/hole transporting layer/emitting layer/electron injecting layer/cathode,
ix) Anode/insulator layer/emitting layer/insulator layer/cathode,
x) Anode/inorganic semiconductor layer/insulator layer/emitting layer/insulator layer/cathode,
xi) Anode/organic semiconductor layer/insulator layer/emitting layer/insulator layer/cathode,
xii) Anode/insulator layer/hole injecting layer/hole transporting layer/emitting layer/insulator layer/cathode, and
xiii) Anode/insulator layer/hole injecting layer/hole transporting layer/emitting layer/electron injecting layer/cathode.

Usually, the structure viii) out of these is preferably used. Specific examples of the materials are described in detail below. The emitting layer may have a stacked structure as the above-mentioned embodiments.

The transparent substrate is a substrate for supporting the organic EL device, and is preferably a flat or smooth substrate having a transmittance of 50% or more to light rays within visible ranges of 400 to 700 nm.

Specific examples thereof include a glass plate and a polymer plate. Examples of the glass plate include soda-lime glass, barium/strontium-containing glass, lead glass, aluminosilicate glass, borosilicate glass, barium borosilicate glass, and quartz. Examples of the polymer plate include polycarbonate, acrylic polymer, polyethylene terephthalate, polyethersulfide, and polysulfone.

An anode is preferably made of an electrode material with a large work function (4 eV or more), which is a metal, alloy, electroconductive compound or mixture thereof. Specific examples of the electrode materials include conductive materials such as metals e.g., Au, CuI, ITO, IZO, $SnO_2$ and ZnO.

The anode can be formed by forming these electrode materials into a thin film by vapor deposition, sputtering or the like.

In the case where luminescence from the emitting layer is taken out through the anode, the transmittance of the anode to the luminescence is preferably more than 10%.

The sheet resistance of the anode is preferably several hundreds $\Omega/\square$ or less. The film thickness of the anode, which is varied in accordance with the material thereof, is usually from 10 nm to 1 μm, preferably from 10 to 200 nm.

The hole injecting, transporting layer is a layer for helping the injection of holes into the emitting layer so as to transport holes to a light emitting region. The hole mobility thereof is large and the ionization energy thereof is usually as small as 5.5 eV or less. Such a hole injecting, transporting layer is preferably made of a material which can transport holes to the emitting layer at a lower electric field intensity. The hole mobility thereof is preferably at least $10^{-4}$ cm$^2$/V·second when an electric field of, e.g., $10^4$ to $10^6$ V/cm is applied.

The material for forming the hole injecting, transporting layer is not particularly limited so long as the material has the above-mentioned preferred natures. The material can be arbitrarily selected from materials which have been widely used as a hole transporting material in photoconductive materials and known materials used in a hole injecting layer of organic EL devices.

Specific examples thereof include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. Nos. 3,717,462, JP-A-54-59143, 55-52063, 55-52064, 55-46760, 55-85495, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive oligomers (in particular thiophene oligomers) disclosed in JP-A-1-211399.

The above-mentioned substances can be used as the material of the hole injecting, transporting layer. The following are preferably used: porphyrin compounds (disclosed in JP-A-63-2956965 and others), aromatic tertiary amine compounds and styrylamine compounds (see U.S. Pat. No. 4,127,412, JP-A-53-27033, 54-58445, 54-149634, 54-64299, 55-79450, 55-144250, 56-119132, 61-295558, 61-98353 and 63-295695, and others), in particular, the aromatic tertiary amine compounds.

The following can also be given as examples: 4,4'-bis (N-(1-naphthyl)-N-phenylamino)biphenyl (hereinafter abbreviated to NPD), which has in the molecule thereof two condensed aromatic rings, disclosed in U.S. Pat. No. 5,061,569, and 4,4',4''-tris(N-(3-methylphenyl)-N-phenylamino) triphenylamine (hereinafter abbreviated to MTDATA), wherein three triphenylamine units are linked to each other in a starburst form, disclosed in JP-A-4-308688.

Inorganic compounds such as aromatic dimethylidene type compounds, p-type Si and p-type SiC can also be used as the material of the hole injecting, transporting layer.

The hole injecting, transporting layer can be formed by making the above-mentioned compound(s) into a thin film by a known method, such as vacuum deposition, spin coating, casting or LB technique. The film thickness of the hole injecting, transporting layer is not particularly limited, and is usually from 5 nm to 5 μm. This hole injecting, transporting layer may be a single layer made of one or more out of the above-mentioned materials. A hole injecting, transporting layer made of a compound different from that in another hole injecting, transporting layer may be laminated thereon.

In the invention, a hole injecting layer is preferably formed between an anode and an emitting layer. A compound of which the hole injecting layer is made preferably contains a phenylene diamine structure.

The organic semiconductor layer is a layer for helping the injection of holes or electrons into the emitting layer, and is preferably a layer having an electroconductivity of $10^{-10}$ S/cm or more. The material of such an organic semiconductor layer may be an electroconductive oligomer, such as thiophene-containing oligomer or arylamine-containing oligomer disclosed in JP-A-8-193191, an electroconductive dendrimer such as arylamine-containing dendrimer.

The electron injecting layer is a layer for helping the injection of electrons into the emitting layer, and has a large electron mobility. The adhesion improving layer is a layer made of a material particularly good in adhesion to the cathode among such electron injecting layers. The material used in the electron injecting layer is preferably a metal complex of 8-hydroxyquinoline or a derivative thereof.

Specific examples of the above-mentioned metal complex of 8-hydroxyquinoline or derivative include metal chelate oxynoid compounds each containing a chelate of oxine (generally, 8-quinolinol or 8-hydroxyquinoline).

For example, Alq can be used in the electron injecting layer.

Examples of the oxadiazole derivative include electron transferring compounds represented by the following general formulas.

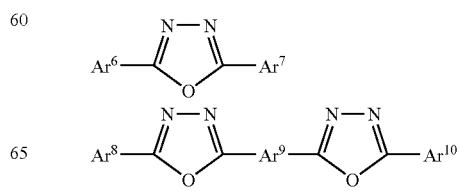

-continued

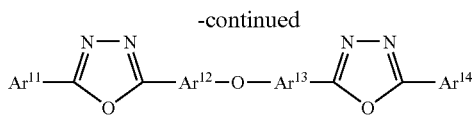

wherein $Ar^6$, $Ar^7$, $Ar^8$, $Ar^{10}$, $Ar^{11}$ and $Ar^{14}$ each represent a substituted or unsubstituted aryl group and may be the same as or different from each other, and $Ar^9$, $Ar^{12}$ and $Ar^{13}$ represent substituted or unsubstituted arylene groups and may be the same as or different from each other.

Examples of the aryl group include phenyl, biphenyl, anthranyl, perylenyl, and pyrenyl groups. Examples of the arylene group include phenylene, naphthylene, biphenylene, anthranylene, perylenylene, and pyrenylene groups. Examples of the substituent include alkyl groups with 1 to 10 carbons, alkoxy groups with 1 to 10 carbons, and a cyano group. The electron transferring compounds are preferably ones having capability of forming a thin film.

Specific examples of the electron transferring compounds include the following.

This cathode can be formed by making the electrode substance(s) into a thin film by vapor deposition, sputtering or some other method.

In the case where luminescence from the emitting layer is taken out through the cathode, it is preferred to make the transmittance of the cathode to the luminescence larger than 10%.

The sheet resistance of the cathode is preferably several hundreds Ω/□ or less, and the film thickness thereof is usually from 10 nm to 1 μm, preferably from 50 to 200 nm.

In the organic EL device, pixel defects based on leakage or a short circuit are easily generated since an electric field is applied to the super thin film. In order to prevent this, it is preferred to insert an insulator thin layer between the pair of electrodes.

Examples of the material used in the insulator layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide.

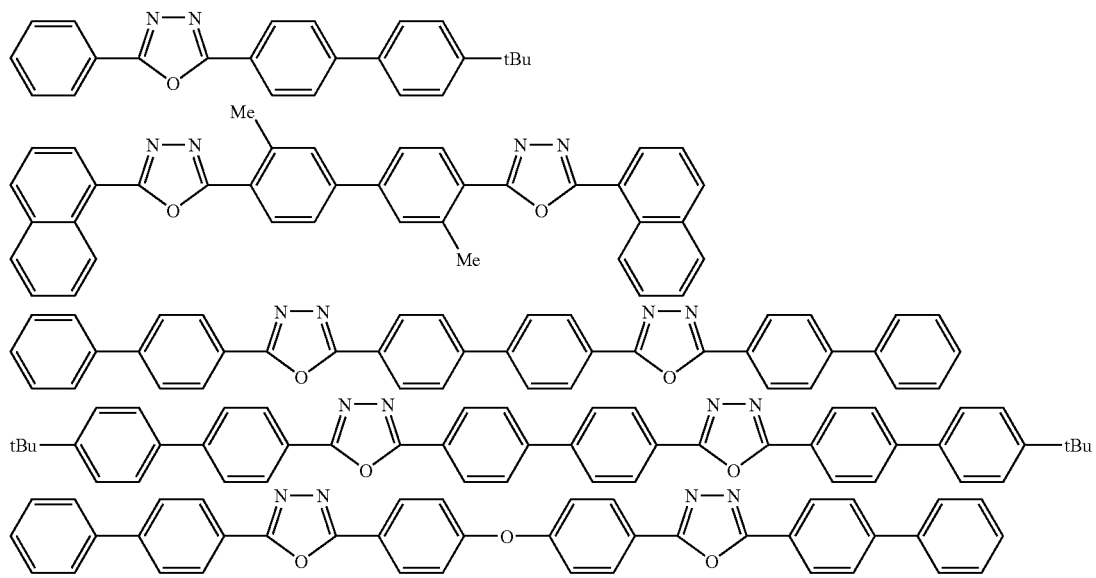

An electron injection layer may be formed which is made of an alkali metal oxide, alkaline earth metal oxide, alkali metal halide or alkaline earth metal halide. Specific examples thereof include lithium fluoride, lithium oxide, cesium fluoride, cesium oxide, magnesium oxide, magnesium fluoride, calcium oxide and calcium fluoride.

Furthermore, a small amount of an alkali metal or an alkaline earth metal may be added to an organic compound layer to form an electron injection region. The addition amount thereof is preferably from 0.1 to 10 mol %.

For the cathode, the following may be used: an electrode substance made of a metal, an alloy or an electroconductive compound which has a small work function (4 eV or less), or a mixture thereof. Specific examples of the electrode substance include sodium, sodium-potassium alloy, magnesium, lithium, magnesium/silver alloy, aluminum/aluminum oxide, aluminum/lithium alloy, indium, and rare earth metals.

A mixture or laminate thereof may be used.

The organic EL device can be produced by forming an anode and an emitting layer, optionally forming a hole injecting layer and an electron injecting layer, and further forming a cathode by use of the materials and methods exemplified above. The organic EL device can be produced in the order reverse to the above, i.e., the order from a cathode to an anode.

An example of the production of the organic EL device will be described below which has a structure wherein the following are successively formed over a transparent substrate: anode/hole injecting layer/first emitting layer/second emitting layer/electron injecting layer/cathode.

First, a thin film made of an anode material is formed into a thickness of 1 μm or less, preferably 10 to 200 nm on an appropriate transparent substrate by vapor deposition, sputtering or some other method, thereby forming an anode.

Next, a hole injecting layer is formed on this anode. As described above, the hole injecting layer can be formed by vacuum deposition, spin coating, casting, LB technique, or some other method. Vacuum deposition is preferred since a homogenous film is easily obtained and pinholes are not easily generated. In the case where the hole injecting layer is formed by vacuum deposition, conditions for the deposition are varied in accordance with the used compound (the material for the hole injecting layer), the crystal structure or recombining structure of the hole injecting layer, and others. In general, the conditions are appropriately selected from the following: deposition source temperatures of 50 to 450° C., vacuum degrees of $10^{-7}$ to $10^{-3}$ torr, vapor deposition rates of 0.01 to 50 nm/second, substrate temperatures of −50 to 300° C., and film thicknesses of 5 nm to 5 μm.

Next, a first emitting layer is disposed on the hole injecting layer. The first emitting layer can be formed by using a desired organic luminescent material and making the material into a thin film by vacuum deposition, sputtering, spin coating, casting or some other method. Vacuum deposition is preferred since a homogenous film is easily obtained and pinholes are not easily generated. In the case where the emitting layer is formed by vacuum deposition, conditions for the deposition, which are varied dependently on the used compound, can be generally selected from conditions similar to those for the hole injecting layer.

Next, a second organic emitting layer is formed on the first organic emitting layer by the same method as the first layer.

Next, an electron injecting layer is formed on this second emitting layer. Like the hole injecting layer and the emitting layers, the layer is preferably formed by vacuum deposition in order to obtain a homogenous film. Conditions for the deposition can be selected from conditions similar to those for the hole injecting layer and the emitting layers.

Lastly, a cathode is laminated thereon to obtain an organic EL device.

The cathode is made of a metal, and vapor deposition or sputtering may be used. However, vacuum deposition is preferred in order to protect underlying organic layers from being damaged when the cathode film is formed.

About the organic EL device production that has been described so far, it is preferred that the formation from the anode to the cathode is continuously carried out, using only one vacuuming operation.

In the case where a DC voltage is applied to the organic EL device, luminescence can be observed when the polarity of the anode and that of the cathode are made positive and negative, respectively, and the voltage of 5 to 40 V is applied. Even if a voltage is applied thereto in the state that the polarities are reverse to the above, no electric current flows so that luminescence is not generated at all. In the case where an AC voltage is applied thereto, uniform luminescence can be observed only when the polarity of the anode and that of the cathode are made positive and negative, respectively. The waveform of the AC to be applied may be arbitrarily selected.

EXAMPLES

The invention will be described with reference to examples hereinafter.

The properties of compounds used and organic EL devices produced in examples were evaluated in the following ways.
(1) Ionization potential: It was measured with a photoelectron spectroscopic instrument (AC-1, Riken Keiki Co., LTD) in air. Specifically, light was irradiated to a material and the amount of electrons generated by charge separation was measured.
(2) Energy gap: It was measured based on an absorption edge of an absorption spectrum in benzene. Specifically, an absorption spectrum was measured with a commercially available ultraviolet-visible spectrophotometer. The energy gap was calculated from the wavelength in which the spectrum begins to raise.
(3) Affinity level: It was calculated from the measured values of an ionization potential and an energy gap.
(4) Half life: A sealed device was measured for the half life at room temperature at 1000 nit of an initial luminance and constant current.

The formulas of compounds used in examples and comparative examples are shown below.

The ionization potentials, affinity levels and energy gaps of compounds used in emitting layers are shown in Table 1.

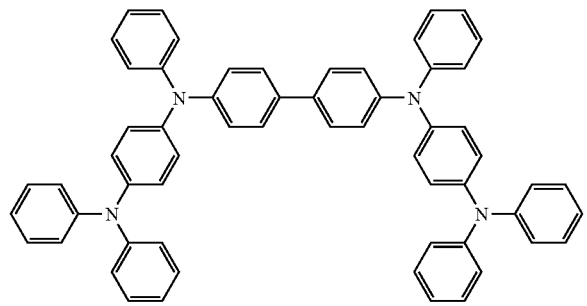

TPD232

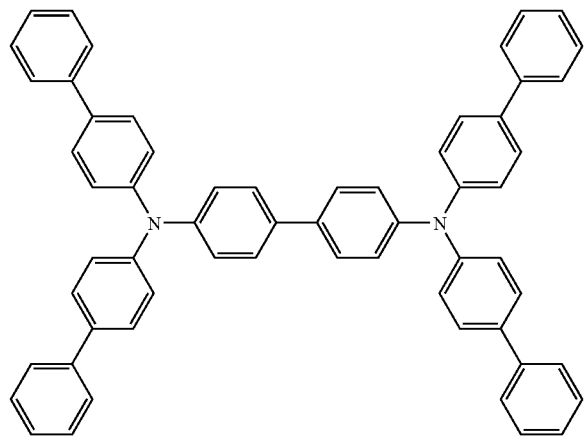

TBDB

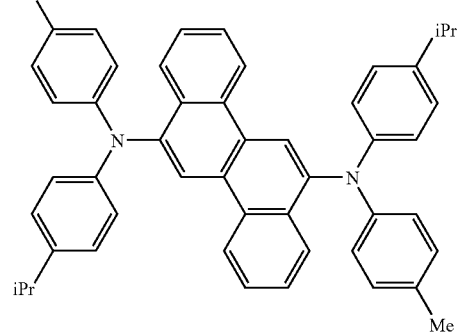

D1

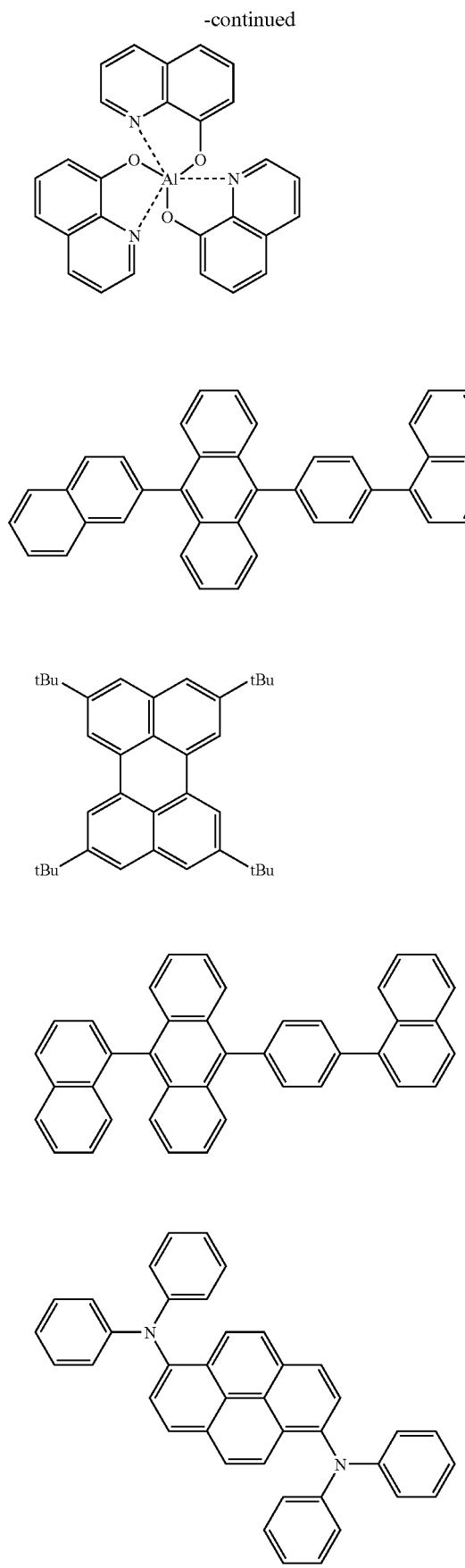
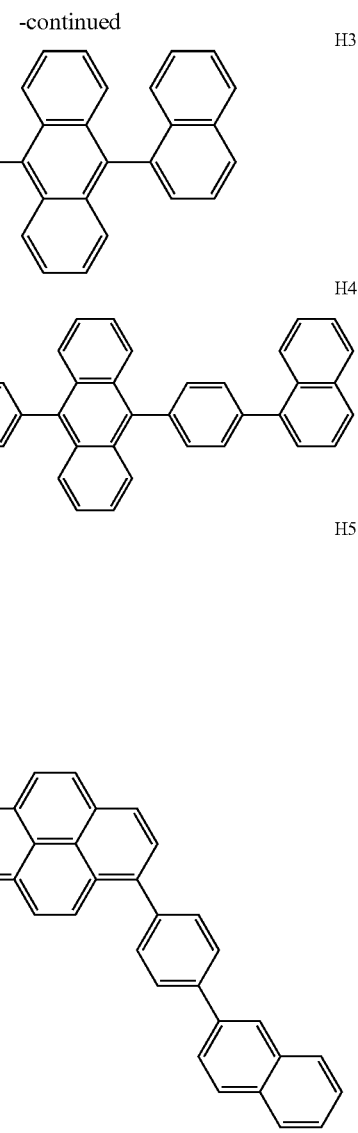

TABLE 1

| Compound | Ionization potential | Affinity level | Energy gap |
|---|---|---|---|
| H1 | 5.74 eV | 2.76 eV | 2.98 eV |
| H2 | 5.74 eV | 2.76 eV | 2.98 eV |
| H3 | 5.67 eV | 2.67 eV | 3.00 eV |
| H4 | 5.70 eV | 2.71 eV | 2.99 eV |
| H5 | 5.78 eV | 2.68 eV | 3.10 eV |
| D1 | 5.32 eV | 2.51 eV | 2.81 eV |
| D2 | 5.67 eV | 2.97 eV | 2.70 eV |
| D3 | 5.52 eV | 2.77 eV | 2.75 eV |

Example 1

A glass substrate, 25 mm×75 mm×1.1 mm thick, having an ITO transparent electrode (manufactured by Geomatics Co.) was subjected to ultrasonic cleaning in isopropyl alcohol for 5 minutes followed by UV ozone cleaning for 30 minutes.

The cleaned glass substrate having transparent electrode lines was set up on a substrate holder in a vacuum deposition device. First, an N,N'-bis(N,N'-diphenyl-4-aminophenyl)-N, N-diphenyl-4,4'-diamino-1,1'-biphenyl film (abbreviated to "TPD 232 film" hereinafter) was formed in a thickness of 60 nm on the surface on which the transparent electrode lines were formed, so as to cover the transparent electrode. This TPD 232 film functioned as a hole-injecting layer.

After the formation of the TPD 232 film, a 20 nm thick N,N,N',N'-tetra(4-biphenyl)-diaminobiphenylene layer (abbreviated to "TBDB layer" hereinafter) was formed on the TPD 232 film. This film functioned as a hole-transporting layer.

Furthermore, a 20 nm thick compound (H1) was deposited to form a film. D1 as a hole trapping dopant was deposited at the weight ratio of 1:20 relative to H1 therewith. This film functioned as a first organic emitting layer. Next, a 20 nm thick compound (H1) was deposited to form a film. D2 as an electron trapping dopant was deposited at a weight ratio of 1:20 relative to H1 therewith. This film functioned as a second organic emitting layer.

On this film, a 20 nm thick film of Alq was formed. This film functioned as an electron-transporting layer. Thereafter, LiF film was deposited (thickness: 1 nm). This film functioned as an electron injecting layer. On this LiF film, a metal Al was deposited to form a metal cathode, thereby fabricating an organic EL device.

A half life of this organic EL device and the organic EL devices fabricated in the following examples and comparative examples are shown in Table 2 below. Blue emission was observed in all the organic EL devices.

TABLE 2

|  | Half life (h) |
|---|---|
| Example 1 | 12,000 |
| Example 2 | 10,000 |
| Example 3 | 10,000 |
| Example 4 | 10,000 |
| Example 5 | 12,000 |
| Example 6 | 9,000 |
| Comparative example 1 | 5,000 |
| Comparative example 2 | 900 |
| Comparative example 3 | 4,200 |

Example 2

A compound (H1) was deposited to form a 40 nm thick film instead of forming the first organic emitting layer and the second organic emitting layer in Example 1. D1 as a hole trapping dopant and D2 as an electron trapping dopant were deposited at a weight ratio of 1:1:40 relative to H1 therewith. This film functioned as an organic emitting layer. An organic EL device was fabricated in the same manner as in Example 1 except for the above.

Example 3

A compound (H2) was deposited to form a 20 nm thick film, when forming a second organic emitting layer in Example 1. At the same time, an electron trapping dopant D2 was deposited at a weight ratio of 1:20 relative to H2. This film functioned as a second organic emitting layer. An organic EL device was fabricated in the same manner as in Example 1 except for the above.

Example 4

An organic EL device was fabricated in the same manner as in Example 1 except that a compound (H3) was used instead of the compound (H1).

Example 5

An organic EL device was fabricated in the same manner as in Example 1 except that a compound (H4) was used instead of the compound (H1).

Example 6

An organic EL device was fabricated in the same manner as in Example 1 except that a compound (H5) was used instead of the compound (H1).

Comparative Example 1

A compound (H1) was deposited to form a 40 nm thick film instead of forming the first organic emitting layer and the second organic emitting layer in Example 1. At the same time, D1 as a hole trapping dopant was deposited at a weight ratio of 2:40 relative to H1. This film functioned as an organic emitting layer. An organic EL device was fabricated in the same manner as in Example 1 except for the above.

Comparative Example 2

A compound (H1) was deposited to form a 40 nm thick film instead of forming the first organic emitting layer and the second organic emitting layer in Example 1. At the same time, D2 as an electron trapping dopant was deposited at a weight ratio of 2:40 relative to H1. This film functioned as an organic emitting layer. An organic EL device was fabricated in the same manner as in Example 1 except for the above.

Comparative Example 3

A compound (H1) was deposited to form a 20 nm thick film, when forming a second organic emitting layer in Example 1. At the same time, a dopant D3 was deposited at a weight ratio of 1:20 relative to H1. An organic EL device was fabricated in the same manner as in Example 1 except for the above.

INDUSTRIAL APPLICABILITY

The organic EL device of the invention has an excellent lifetime while having a high luminance and high luminous efficiency. Therefore, it can be suitably used for flat light emitters of wall-hanging televisions, light sources such as display backlights, display parts of cell phones and PDA, instrument panels for car navigation systems and vehicles, lighting devices and so on.

What is claimed is:

1. An organic electroluminescent device comprising:
   an anode,
   a cathode and
   an organic emitting layer held therebetween, the organic emitting layer containing one or more host materials, a hole trapping dopant and an electron trapping dopant, wherein the following formulae are satisfied:

$I_{hh} - I_{hd} \geq 0.2$ eV $A_{ed} - A_{eh} \geq 0.2$ eV wherein Ihh is the ionization potential of a host material containing the hole trapping dopant, Ihd is the ionization potential of the hole trapping dopant, Aed is the affinity level of the electron trapping dopant, and Aeh is the affinity level of a host material containing the electron trapping dopant.

2. A display comprising the organic electroluminescent device of claim 1.

3. The organic electroluminescent device according to claim 1 which satisfies the following formula, $$Ihh-Ahh>Ihd-Ahd\geq 2.7\ eV$$

wherein Ihh is the ionization potential of the host material containing the hole trapping dopant, Ahh is the affinity level of the host material containing the hole trapping dopant, Ihd is the ionization potential of the hole trapping dopant and Ahd is the affinity level of the hole trapping dopant.

4. The organic electroluminescent device according to claim 3 which satisfies the following formula, $$Ieh-Aeh>Ied-Aed\geq 2.7\ eV$$

wherein Ieh is the ionization potential of the host material containing the electron trapping dopant, Aeh is the affinity level of the host material containing the electron trapping dopant, Ied is the ionization potential of the electron trapping dopant and Aed is the affinity level of the electron trapping dopant.

5. The organic electroluminescent device according to claim 4 which satisfies the following formulas:

$$Ihh-Ahh>2.9\ eV\ \text{and},$$

$$Ieh-Aeh>2.9\ eV$$

wherein Ihh is the ionization potential of the host material containing the hole trapping dopant, Ahh is the affinity level of the host material containing the hole trapping dopant, Ieh is the ionization potential of the host material containing the electron trapping dopant and Aeh is the affinity level of the host material containing the electron trapping dopant.

6. The organic electroluminescent device according to claim 5 which satisfies the following formula, $$Ieh-Ied<0.2\ eV$$

wherein Ieh is the ionization potential of the host material containing the electron trapping dopant and Ied is the ionization potential of the electron trapping dopant.

7. The organic electroluminescent device according to claim 6, wherein the host material containing the hole trapping dopant is nearer to the anode than the host material containing the electron trapping dopant.

8. The organic electroluminescent device according to claim 6, wherein the host material containing the hole trapping dopant and/or the host material containing the electron trapping dopant are/is one or more compounds represented by the following formula (1),

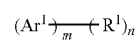

(1)

wherein $Ar^1$ is an aromatic ring with 6 to 30 nucleus carbon atoms or an hetero aromatic ring with 5 to 20 nucleus carbon atoms, $R^1$ is a substituent, m is an integer of 1 to 6, n is an integer of 0 to 30, $Ar^1$s may be the same as or different from each other when m is 2 or more, and $R^1$s may be the same as or different from each other when n is 2 or more.

9. The organic electroluminescent device according to claim 6, wherein the hole trapping dopant is an aromatic amine derivative containing a condensed ring.

10. The organic electroluminescent device according to claim 6, wherein the hole trapping dopant is a compound represented by the following formula (2),

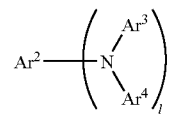

(2)

wherein $Ar^2$ to $Ar^4$ are a substituted or unsubstituted aromatic ring with 6 to 50 nucleus carbon atoms or a substituted or unsubstituted hetero aromatic ring with 5 to 50 nucleus carbon atoms, l is an integer of 1 to 4, $Ar^3$s may be the same or different and $Ar^4$ may be the same or different when l is 2 or more, and at least one of $Ar^2$ to $Ar^4$ has a substituted or unsubstituted condensed aromatic ring with 10 to 50 nucleus carbon atoms or a styryl group.

11. The organic electroluminescent device according to claim 10, wherein the hole trapping dopant is a compound represented by the formula (2) wherein at least one of $Ar^2$ to $Ar^4$ is a substituted or unsubstituted condensed-aromatic-ring with 10 to 50 nucleus carbon atoms or a styryl-substituted aromatic ring with 6 to 50 nucleus carbon atoms.

12. The organic electroluminescent device according to claim 6, wherein the electron trapping dopant is a compound represented by the following formula (3)

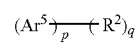

(3)

where $Ar^5$ is an aromatic ring with 14 to 50 nucleus carbon atoms or a hetero aromatic ring with 5 to 50 nucleus carbon atoms, $R^2$ is a substituent, p is an integer of 1 to 6, q is an integer of 0 to 30, $Ar^5$ may be the same as or different from each other when p is 2 or more, and $R^2$ may be the same as or different from each other when q is 2 or more.

* * * * *